(12) United States Patent
Lee et al.

(10) Patent No.: US 11,081,532 B2
(45) Date of Patent: Aug. 3, 2021

(54) DISPLAY DEVICE

(71) Applicant: Samsung Display Co., Ltd., Yongin-si (KR)

(72) Inventors: Gak Seok Lee, Hwaseong-si (KR); Byung-Chul Kim, Suwon-si (KR); Chang-Soon Jang, Seoul (KR); In Ok Kim, Osan-si (KR); Inseok Song, Pocheon-si (KR); Keunchan Oh, Hwaseong-si (KR); Jieun Jang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/687,562

(22) Filed: Nov. 18, 2019

(65) Prior Publication Data

US 2020/0212109 A1   Jul. 2, 2020

(30) Foreign Application Priority Data

Dec. 28, 2018 (KR) .................. 10-2018-0172130

(51) Int. Cl.
*H01L 27/32* (2006.01)
*H01L 51/52* (2006.01)
*G02F 1/1335* (2006.01)

(52) U.S. Cl.
CPC ...... *H01L 27/322* (2013.01); *G02F 1/133514* (2013.01); *H01L 51/5268* (2013.01);
(Continued)

(58) Field of Classification Search
CPC ............. H01L 27/322; H01L 27/3244; H01L 27/3209; H01L 27/3246; H01L 51/0032;
(Continued)

(56) References Cited

U.S. PATENT DOCUMENTS 10,184,618 B2   1/2019  Yoon et al.
10,978,677 B2 * 4/2021  Kim .................... H01L 51/5275
(Continued)

FOREIGN PATENT DOCUMENTS

JP    2003-332069 A    11/2003
JP    2015-175924 A    10/2015
(Continued)

OTHER PUBLICATIONS

Extended European Search Report for corresponding European Patent Application No. 19219776.2, dated Jun. 9, 2020, 5 pages.

*Primary Examiner* — Mohsen Ahmadi
(74) *Attorney, Agent, or Firm* — Lewis Roca Rothgerber Christie LLP

(57) ABSTRACT

Provided is a display apparatus including a display module having a folding region and a plurality of non-folding regions adjacent to the folding region and including a display surface configured to display an image, and a support member below the display module and supporting the display module, wherein the display module is operated in a plurality of modes, and the plurality of modes includes a first mode in which the folding region has a first curvature radius and is folded in a first bending direction which surrounds a virtual first bending axis defined below the display module and a second mode in which the folding region has a second curvature radius and is folded in a second bending direction which surrounds a virtual second bending axis defined above the display module, wherein the first curvature radius is greater than the second curvature radius.

20 Claims, 19 Drawing Sheets

(52) U.S. Cl.
CPC ...... *H01L 51/5284* (2013.01); *G02F 2201/52* (2013.01); *H01L 27/3244* (2013.01)

(58) Field of Classification Search
CPC ............. H01L 51/5056; H01L 51/5237; H01L 51/5284; G02F 1/133514; G02F 2201/52; G02F 2001/136222; G02F 2001/133521
See application file for complete search history.

(56) References Cited

U.S. PATENT DOCUMENTS

| | | | | |
|---|---|---|---|---|
| 2008/0316410 | A1* | 12/2008 | Fujii | G02F 1/13439 349/139 |
| 2012/0199856 | A1* | 8/2012 | Koresawa | H01L 27/322 257/89 |
| 2012/0242566 | A1* | 9/2012 | Zhang | G06F 3/017 345/156 |
| 2014/0368766 | A1* | 12/2014 | Shibata | G02F 1/133553 349/61 |
| 2015/0048348 | A1 | 2/2015 | Huang et al. | |
| 2016/0003998 | A1 | 1/2016 | Benoit et al. | |
| 2016/0033823 | A1* | 2/2016 | Lee | G02F 1/133617 349/71 |
| 2016/0041430 | A1 | 2/2016 | Lee et al. | |
| 2016/0276421 | A1* | 9/2016 | Lee | H01L 27/326 |
| 2016/0306226 | A1* | 10/2016 | Yoon | G02F 1/133377 |
| 2018/0047880 | A1* | 2/2018 | Lim | H01L 33/507 |
| 2019/0155094 | A1* | 5/2019 | Kim | G02F 1/1339 |
| 2019/0196661 | A1* | 6/2019 | Baek | G09G 3/3225 |
| 2020/0110303 | A1* | 4/2020 | Lee | H01L 51/5284 |
| 2020/0152919 | A1* | 5/2020 | Joo | H01L 51/5284 |

FOREIGN PATENT DOCUMENTS

| | | |
|---|---|---|
| KR | 10-2014-0141906 A | 12/2014 |
| KR | 10-2015-0069947 A | 6/2015 |
| KR | 10-2017-0038596 A | 4/2017 |
| KR | 10-2018-0085849 A | 7/2018 |
| KR | 10-2018-0092326 A | 8/2018 |

* cited by examiner

DISPLAY DEVICE

CROSS-REFERENCE TO RELATED APPLICATIONS

This application claims priority to and the benefit of Korean Patent Application No. 10-2018-0172130, filed on Dec. 28, 2018, the entire contents of which are incorporated herein by reference.

BACKGROUND

1. Field

Embodiments of the present disclosure herein relate to a display device, and, for example, to a display device including a color filter layer and a color conversion layer.

2. Description of the Related Art

Various display devices used for multimedia devices such as a television, a mobile phone, a tablet computer, a navigation system, a game machine are being developed. When external light is provided into the display device when using such a display device, the provided external light is reflected from an electrode in a display panel, or from an interface between laminated layers in the display device, thereby deteriorating or reducing display quality.

Accordingly, there has been a demand for studies on preventing or reducing the deterioration of display quality due to light provided from the outside.

SUMMARY

Embodiments of the present disclosure provide a display device having improved display quality by adjusting the color sense of reflected light generated due to reflection caused by external light.

Embodiments of the present disclosure also provide a display device capable of displaying a neutral reflective color by improving yellowish color sense.

An embodiment of the present disclosure provides a display device including a display panel including a light emitting region and a non-light emitting region adjacent to the light emitting region, a color conversion layer on the display panel, a light blocking layer on the display panel and having a main opening portion corresponding to the light emitting region and a sub-opening portion corresponding to the non-light emitting region, the main opening portion and the sub-opening portion being defined at the light blocking layer; and a color filter layer on the color conversion layer, wherein the color filter layer includes a main filter portion corresponding to the main opening portion, a sub-filter portion corresponding to the sub-opening portion, and a light blocking filter portion corresponding to the non-light emitting region and not overlapping the sub-opening portion.

In an embodiment, the display panel may include an organic electroluminescent device configured to emit a first color light.

In an embodiment, the color conversion layer may include a first color conversion part including a first quantum dot configured to convert the first color light into a second color light, a second color conversion part including a second quantum dot configured to convert the first color light into a third color light, and a third color conversion part configured to transmit the first color light.

In an embodiment, the color filter layer may include a first filter configured to transmit the second color light, a second filter configured to transmit the third color light, and a third filter configured to transmit the first color light, wherein each of the first filter, the second filter, and the third filter may include the main filter portion and the light blocking filter portion, and at least one of the first filter, the second filter, and the third filter may further include the sub-filter portion.

In an embodiment, the first color light may be blue light, the second color light may be red light, and the third color light may be green light, and the first filter and the third filter may include the sub-filter portion, but the second filter may not include the sub-filter portion.

In an embodiment, the third color conversion part and the third filter may be provided integrally (e.g., are integral with one another).

In an embodiment, the first color conversion part and the third color conversion part may further include a scattering agent.

In an embodiment, the color filter layer may include a third filter overlapping the third color conversion part and configured to transmit the first color light, and a fourth filter overlapping the first color conversion part and the second color conversion part and configured to transmit a fourth color light.

In an embodiment, the light blocking layer may be between the display panel and the color filter layer.

In an embodiment, the light blocking layer may be on the color conversion layer, and the color filter layer may cover the light blocking layer.

In an embodiment, the color filter layer may be directly on the color conversion layer.

In an embodiment of the present disclosure, a display device including a light emitting region, a reflective region spaced apart from the light emitting region on a plane, and a light blocking region surrounding the light emitting region and the reflective region includes a display panel including an organic electroluminescent device, a color conversion layer on the display panel and including a plurality of color conversion parts located to correspond to the light emitting region, a color filter layer on the color conversion layer and including a plurality of filters, and a light blocking layer on the display panel and including a light blocking unit overlapping the light blocking region but not overlapping the light emitting region and the reflective region.

In an embodiment, the light emitting region may include a red light emitting region, a green light emitting region, and a blue light emitting region, and the reflective region may include a red reflective region and a blue reflective region.

In an embodiment, the light emitting region may include a plurality of red light emitting regions, a plurality of green light emitting regions, and a plurality of blue light emitting regions, wherein the red light emitting regions, the green light emitting regions, and the blue light emitting regions may be alternately arranged in a first direction, and each of the red light emitting regions, the green light emitting regions, and the blue light emitting regions may be arranged in a second direction crossing the first direction.

In an embodiment, the reflective region may include a red reflective region between the red light emitting regions arranged in the second direction, and a blue reflective region between the blue light emitting regions arranged in the second direction.

In an embodiment, the organic electroluminescent device may be configured to emit blue light, and the color conversion parts may include a first color conversion part located to correspond to the red light emitting region and including a red quantum dot, a second color conversion part located to correspond to the green light emitting region and including a green quantum dot, and a third color conversion part located to correspond to the blue light emitting region.

In an embodiment, the filters may include a red filter overlapping the red light emitting region and the red reflective region, a green filter overlapping the green light emitting region, and a blue filter overlapping the blue light emitting region and the blue reflective region.

In an embodiment, on a plane, the area of the red light emitting region may be greater than the area of the green light emitting region and the area of the blue light emitting region.

In an embodiment, a ratio of the area of the reflective region to a total area of the light emitting region, the reflective region, and the light blocking region may be greater than 0% to 10% or less.

In an embodiment of the present disclosure, a display device includes a display panel including an organic electroluminescent device, a color conversion layer on the display panel and including a plurality of color conversion parts spaced apart from each other on a plane, a light blocking layer on the organic electroluminescent display panel and having a main opening portion overlapping the color conversion parts and a sub-opening portion not overlapping the color conversion parts, and a color filter layer on the color conversion layer and including a plurality of filters, wherein each of the filters includes a main filter portion overlapping the main opening portion, and a light blocking filter portion adjacent to the main filter portion, and at least one of the filters further includes a sub-filter portion adjacent to the light blocking filter portion and spaced apart from the main filter portion.

BRIEF DESCRIPTION OF THE DRAWINGS

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
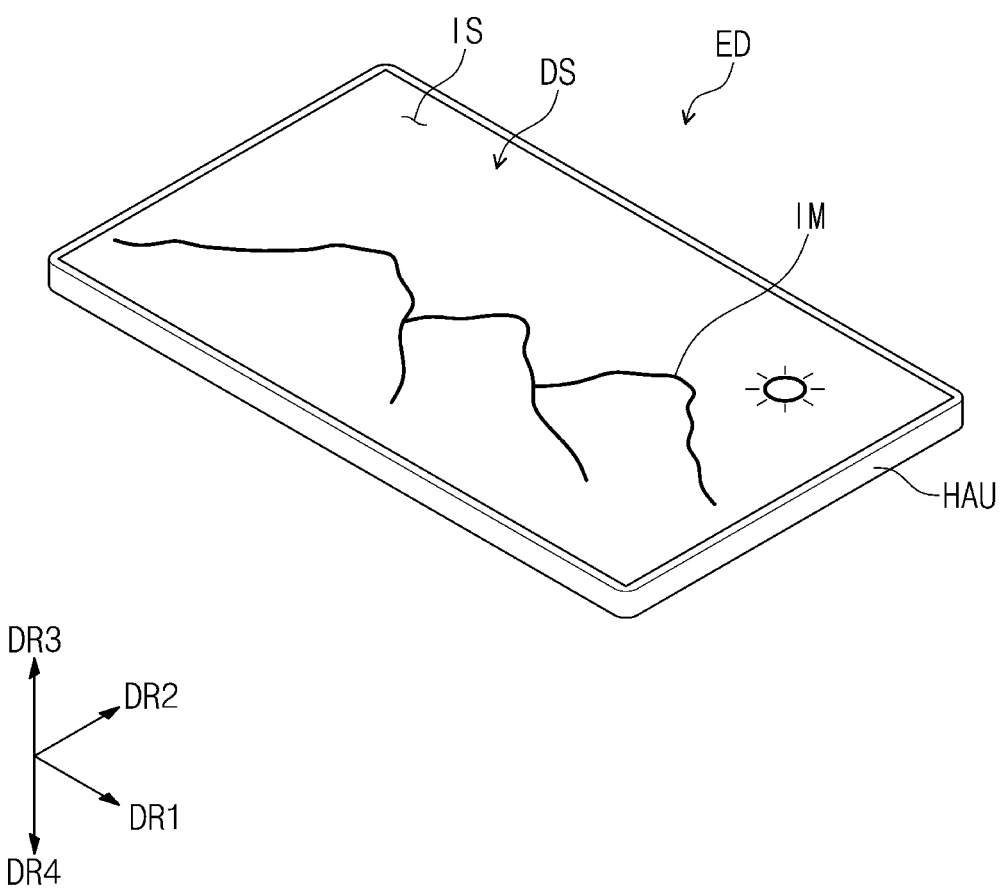
FIG. 1 is a perspective view of an electronic device according to an embodiment of the present disclosure.

The subject matter of the present disclosure may be modified in many alternate forms, and thus, example embodiments will be exemplified in the drawings and described in more detail. It should be understood, however, that it is not intended to limit the present disclosure to the particular forms disclosed, but rather, is intended to cover all modifications, equivalents, and alternatives falling within the spirit and scope of the present disclosure.

In the present disclosure, when an element (or a region, a layer, a portion, etc.) is referred to as being "on," "connected to," or "coupled to" another element, it means that the element may be directly on/connected to/coupled to the other element, or that a third element may be therebetween. In addition, it will also be understood that when an element or layer is referred to as being "between" two elements or layers, it can be the only element or layer between the two elements or layers, or one or more intervening elements or layers may also be present.

Meanwhile, in the present specification, "directly on" means that there is no layer, film, region, plate or the like added between a portion of a layer, a film, a region, a plate or the like and other portions. For example, "directly on" may mean a layer is on another layer or a member is on another member without additional members such as an adhesive member between the two layers or the two members.

Like reference numerals refer to like elements. Also, in the drawings, the thickness, the ratio, and the dimensions of elements may be exaggerated for clarity of description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and should not be interpreted in an idealized or overly formal sense, unless expressly so defined herein.

It should be understood that the terms "comprise", or "have" are intended to specify the presence of stated features, integers, actions, operations, elements, components, or combinations thereof in the disclosure, but do not preclude the presence or addition of one or more other features, integers, actions, operations, elements, components, or combinations thereof.

Hereinafter, a display device according to an embodiment of the present disclosure will be described with reference to the accompanying drawings.

FIG. 1 is a perspective view showing an embodiment of an electronic device ED. In an embodiment, the electronic device ED may be a large electronic device such as a television, a monitor, or an external advertisement board, but the present disclosure is not limited thereto. Also, the electronic device ED may be a small and medium-sized electronic device such as a personal computer, a notebook computer, a personal digital terminal, a car navigation system unit, a game machine, a smart phone, a tablet, or a camera, but the present disclosure is not limited, thereto. It should be understood that these are merely exemplary embodiments, and the electronic device ED may be employed as other electronic devices without departing from the spirit and scope of the present disclosure.

The electronic device ED may include a display device DS and a housing HAU. The display device DS may display an image IM through a display surface IS. In FIG. 1, the display surface IS illustrated as being parallel (e.g., substantially parallel) to a surface defined by a first direction axis DR1 and a second direction axis DR2 crossing the first direction axis DR1. However, this is only exemplary. In another embodiment of the present disclosure, the display surface IS of the display device DS may have a curved shape.

The normal direction of the display surface IS, for example, a direction of thickness directions of the display device DS in which the image IM is displayed is indicated by a third direction axis DR3. In addition, a direction opposite to the third direction axis DR3 of the thickness directions of the display device DS is indicated by a fourth direction axis DR4. A front surface (or an upper surface) and a rear surface (or a lower surface) of each member may be defined by the third direction axis DR3. The present disclosure is not limited to the foregoing, however, as directions indicated by the first direction axis DR1, the second direction axis DR2, the third direction axis, and the fourth direction axis DR4 are a relative concept, and may be converted to other directions.

The housing HAU may receive the display device DS and cover the display device DS such that an upper surface of the display device DS, which is the display surface IS, is exposed. The housing HAU covers a side surface and a bottom surface of the display device DS, and may expose the entire (e.g., substantially the entire) upper surface thereof. However, embodiments of the present disclosure are not limited thereto. The housing HAU may cover not only the side surface and the bottom surface of the display device DS but also a portion of the upper surface thereof.

Figure 2:
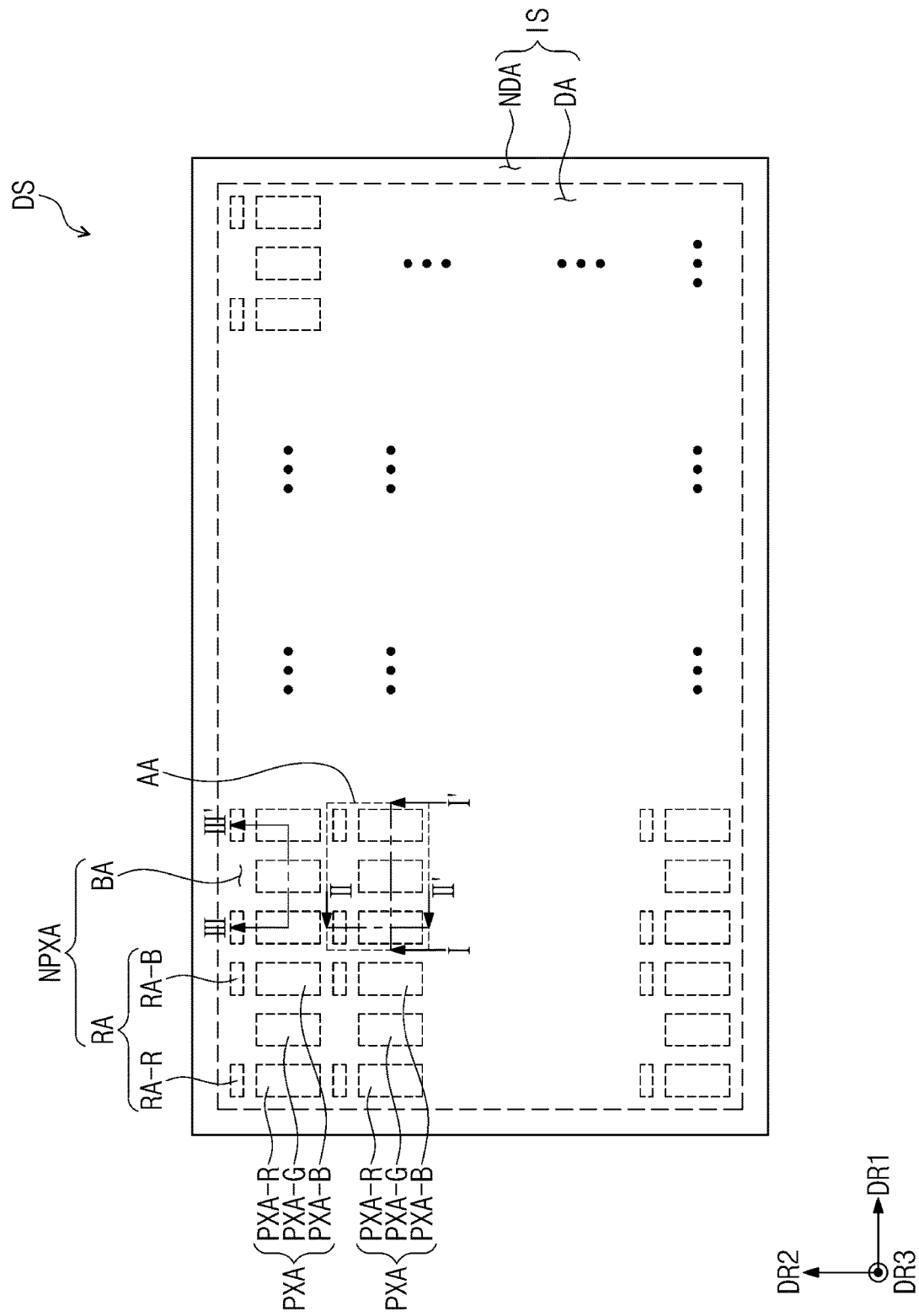
FIG. 2 is a plan view of a display device according to an embodiment of the present disclosure.
Figure 3:
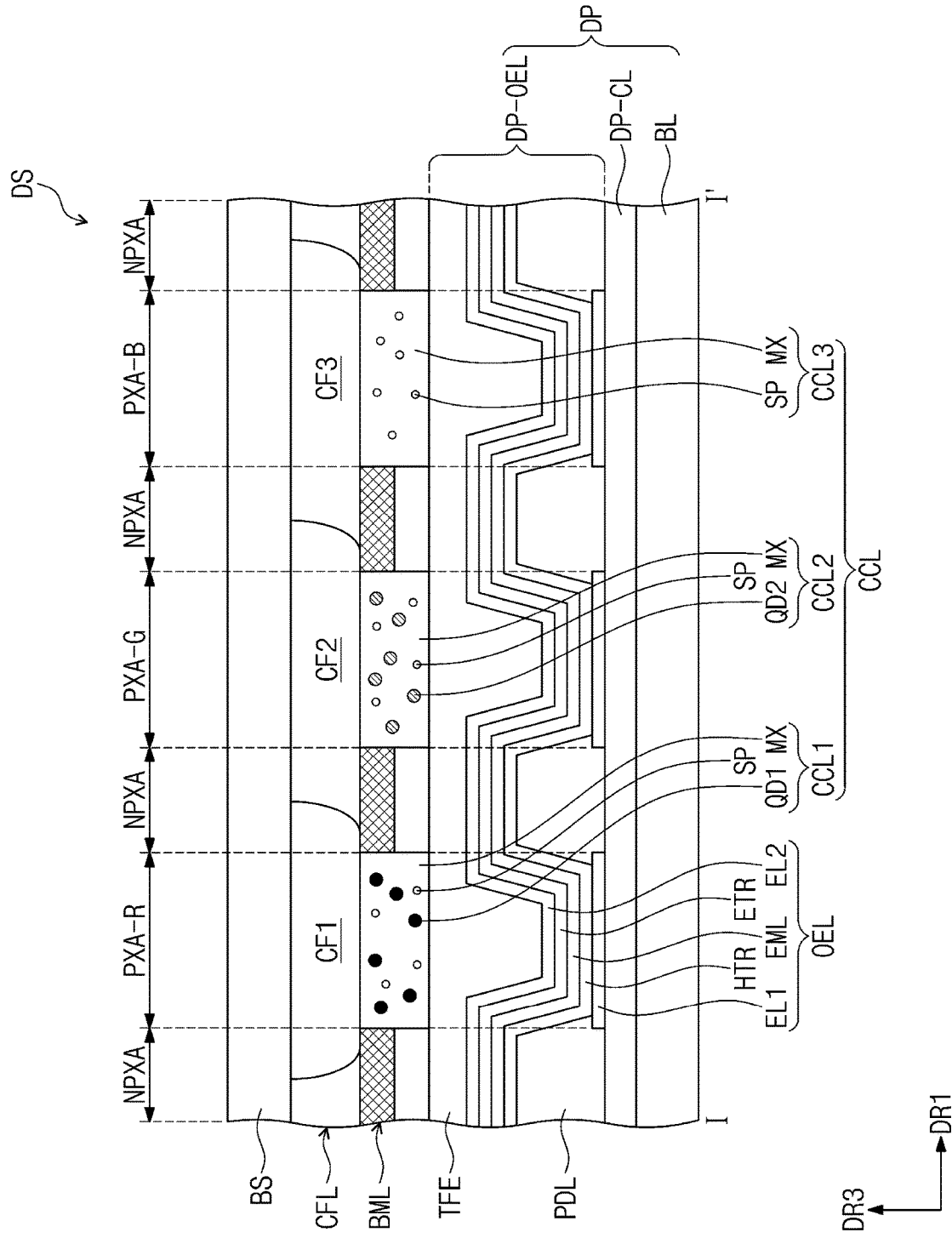
FIG. 3 is a cross-sectional view corresponding to line I-I' of FIG. 2.
Figure 4:
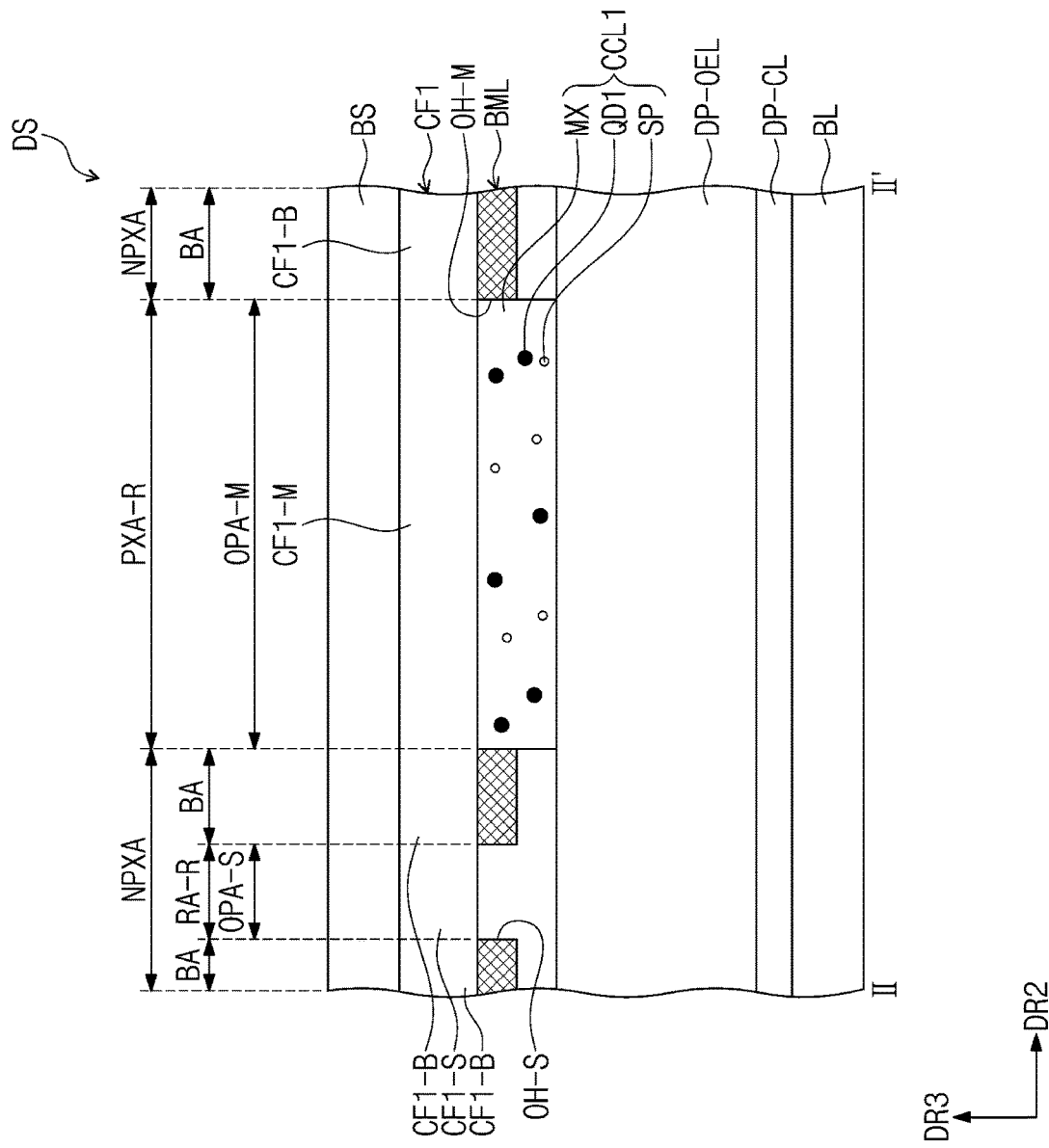
FIG. 4 is a cross-sectional view of a display device of an embodiment of the present disclosure corresponding to line II-II' of FIG. 2.
Figure 5:
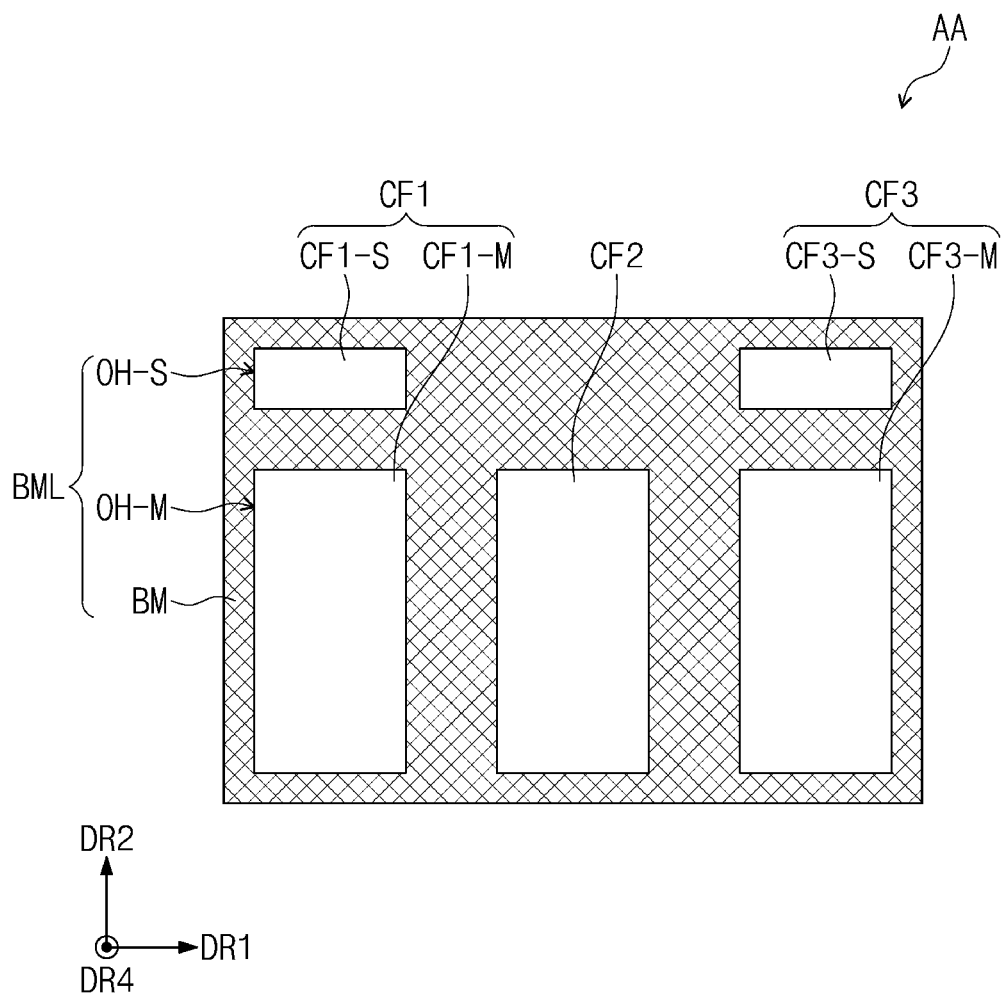
FIG. 5 is a plan view showing a portion of a display device according to an embodiment of the present disclosure.
Figure 6:
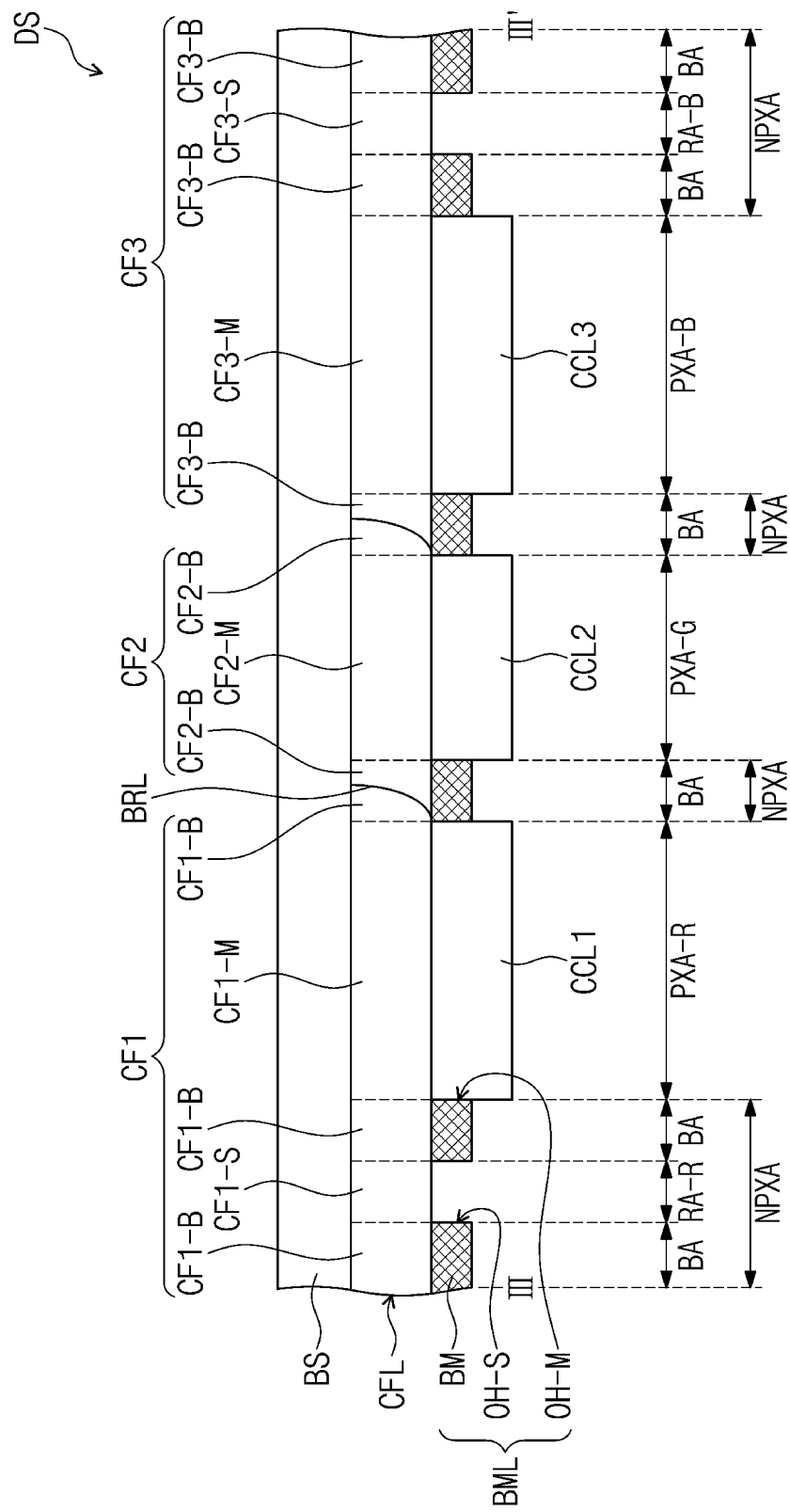
FIG. 6 is a cross-sectional view of a display device of an embodiment of the present disclosure corresponding to line III-III' of FIG. 2.

FIG. 2 is a plan view showing a display device according to an embodiment of the present disclosure. FIG. 3 is a cross-sectional view corresponding to line I-I' of FIG. 2, and FIG. 4 is a cross-sectional view corresponding to line II-II' of FIG. 2. FIG. 5 is a plan view showing a portion of a display device of an embodiment of the present disclosure, and FIG. 6 is a cross-sectional view showing a portion of a display device according to an embodiment of the present disclosure.

Referring to FIG. 2, the display device DS of an embodiment may include a display region DA and a non-display region NDA adjacent to the display region DA. The display region DA corresponds to a portion on which the image IM (see FIG. 1) is displayed.

In an embodiment, the display region DA may have a quadrangular shape. The non-display region NDA may surround the display region DA. However, embodiments of the present disclosure are not limited thereto. The shape of the display region DA and the shape of the non-display region NDA may be correlatively designed (e.g., may be designed in consideration of one another). Also, on the front surface of the display device DS, which is the display surface IS, the non-display region NDA may not be present.

In an embodiment, the display device DS may include a display panel DP, a color conversion layer CCL on the display panel DP, a light blocking layer BML on the display panel DP, and a color filter layer CFL on the color conversion layer CCL. In an embodiment, the display panel DP may include an organic electroluminescent device OEL. For example, the display panel DP may be an organic electroluminescent display panel.

Referring to FIG. 2, the display device DS of an embodiment may include a light emitting region PXA and a non-light emitting region NPXA. The non-light emitting region NPXA may be adjacent to the light emitting region PXA. In some embodiments, the light emitting region PXA and the non-light emitting region NPXA of the display device DS may correspond to the light emitting region PXA and the non-light emitting region NPXA of the display panel DP, respectively.

The light emitting region PXA may include a first light emitting region PXA-R, a second light emitting region PXA-G, and a third light emitting region PXA-B. The first light emitting region PXA-R, the second light emitting region, and the third light emitting region PXA-B may be spaced apart from each other on a plane. In the display device DS of an embodiment, the first light emitting region PXA-R, the second light emitting region PXA-G, and the third light emitting region PXA-B may be repeatedly arranged in the direction of the first direction axis DR1 in the order of the first light emitting region PXA-R, the second light emitting region PXA-G, and the third light emitting region PXA-B.

In some embodiments, a plurality of the first light emitting regions PXA-R may be arranged and located in the direction of the second direction axis DR2 crossing the first direction axis DR1, a plurality of the second light emitting regions PXA-G may be arranged and located in the direction of the second direction axis DR2, and a plurality of the third light emitting regions PXA-B may be arranged and located in the direction of the second direction axis DR2.

For example, in the display device DS of an embodiment, the first light emitting region PXA-R may be a red light emitting region configured to provide red light, the second light emitting region PXA-G may be a green light emitting region configured to provide green light, and the third light emitting region PXA-B may be a blue light emitting region configured to provide blue light.

For example, referring to FIG. 2, each of a plurality of red light emitting regions, a plurality of green light emitting regions, and a plurality of blue light emitting regions may be arranged along the second direction axis DR2. Also, the red light emitting region, the green light emitting region, and the blue light emitting region may be alternately located along the first direction axis DR1. For example, the red light emitting area, the green light emitting area, and the blue light emitting area may be repeatedly located along the first direction axis DR1 in the order of the red light emitting area, the green light emitting area, and the blue light emitting area. However, embodiments of the present disclosure are not limited thereto. The order and arrangement direction of light emitting regions which provide different light may be changed in various suitable ways.

In an embodiment, the non-light emitting region NPXA may include a reflective region RA and a light blocking region BA. The reflective region RA may be a portion from which light provided from the outside of the display device DS and then reflected inside the display device DS is emitted. The light blocking region BA may surround the light emitting region PXA and the reflective region RA. The light blocking region BA may be a portion corresponding to a light blocking part BM to be described herein below.

The reflective region RA may include at least one of a first reflective region RA-R adjacent to the first light emitting region PXA-R and providing light of a wavelength region similar to that of light provided from the first light emitting region PXA-R, and a second reflective region RA-B adjacent to the third light emitting region PXA-B and providing light of a wavelength region similar to that of light provided from the third light emitting region PXA-B.

For example, the reflective region RA may include a red reflective region which is the first reflective region RA-R and a blue reflective region which is the second reflective region RA-B.

The first reflective region RA-R may be provided between the first light emitting regions PXA-R which are arranged by being spaced apart from each other in the second direction axis DR2 direction. Also, the second reflective region RA-B may be provided between the third light emitting regions PXA-B which are arranged by being spaced apart from each other in the second direction axis DR2 direction.

For example, referring to FIG. 2, the light emitting regions PXA-R, PXA-G, and PXA-B, the light blocking region BA, the reflective regions RA-R and RA-B, and the light blocking region BA may be repeatedly located in the display device DS of an embodiment along the second direction axis DR2 direction.

In FIG. 2, the first light emitting region PXA-R and the first reflective region RA-R are illustrated as being alternately provided by one by one in the second direction axis DR2 direction. However, embodiments of the present disclosure are not limited thereto. The disposition interval of the first reflective region RA-R may be adjusted in consideration of the reflective color sense required by the display device DS. For example, the disposition interval of the first reflective region RA-R may be more spaced as compared to that illustrated in FIG. 2. In some embodiments, two first light emitting regions PXA-R and one first reflective region RA-R may be arranged in this order. However, embodiments of the present disclosure are not limited thereto.

Also, the same content as the description of the arrangement relationship of the first light emitting region PXA-R and the first reflective region RA-R may be applied to the third light emitting region PXA-B and the second reflective region RA-B.

In an embodiment, the display panel DP may include a base layer BL, a circuit layer DP-CL provided on the base layer BL, and a display element layer DP-OEL. In an embodiment, the base layer BL, the circuit layer DP-CL, and the display element layer DP-OEL may be sequentially laminated in the third direction axis DR3 direction.

The base layer BL may be a member which provides a base surface on which, the display element layer DP-OEL is located. The base layer BL may be a glass substrate, a metal substrate, a plastic substrate, and/or the like. However, embodiments of the present disclosure are not limited thereto, and the base layer BL may be an inorganic layer, an organic layer, and/or a composite material layer.

In an embodiment, the circuit layer DP-CL is on the base layer BL, and the circuit layer DP-CL may include a plurality of transistors. Each of the plurality of transistors may include a control electrode, an input electrode, and an output electrode. For example, the circuit layer DP-CL may include a switching transistor and a driving transistor configured to drive an organic electroluminescent device OEL.

The display element layer DP-OEL may include the organic electroluminescent device OEL and an encapsulation layer TFE. The organic electroluminescent device OEL may include a first electrode EL1, a hole transport region HTR on the first electrode EL1, a light emitting layer EML on the hole transport region HTR, an electron transport region ETR on the light emitting layer EML, and a second electrode EL2 on the electron transport region ETR.

The encapsulation layer TFE may be on the organic electroluminescent device OEL. The encapsulation layer TFE may cover the organic electroluminescent device OEL. The organic electroluminescent device OEL may be sealed by the encapsulation layer TFE.

The first electrode EL1 constituting the organic electroluminescent device OEL has conductivity (e.g., electrical conductivity). The first electrode EL1 may be formed of a metal alloy and/or a conductive compound. The first electrode EL1 may be an anode. The first electrode EL1 may be a pixel electrode.

In the organic electroluminescent device OEL according to an embodiment, the first electrode EL1 may be a reflective electrode. However, embodiments of the present disclosure are not limited thereto. For example, the first electrode EL1 may be a transmissive electrode or a transflective electrode, and the like. When the first electrode EL1 is a transmissive electrode or a transflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). In some embodiments, the first electrode EL1 may be of a multi-layered structure including a reflective film or a transflective film, both formed of the above exemplified materials, and a transparent conductive film formed of indium tin oxide (ITO), indium zinc oxide (IZO), zinc oxide (ZnO), indium tin zinc oxide (ITZO), and/or the like. For example, the first electrode EL1 may be a multi-layered metal film or may have a structure in which metal and metal oxide films of ITO/Ag/ITO are laminated.

The hole transport region HTR may have a single layer structure having a single layer formed of a single material, a single layer structure having a single layer formed of a plurality of different materials, or a multilayer structure having a plurality of layers formed of a plurality of different materials. For example, the hole transport region HTR may have a single layer structure having a single layer formed of a plurality of different materials, or have a structure of a hole injection layer/a hole transport layer, a hole injection layer/a hole transport layer/a buffer layer, a hole injection layer/a buffer layer, a hole transport layer/a buffer layer, or hole injection layer/a hole transport layer/an electron blocking layer, sequentially laminated on the first electrode EL1, but embodiments of the present disclosure are not limited thereto.

For example, the hole transport region HTR may include a hole injection layer and a hole transport layer, and in the hole injection layer and the hole transport layer, any suitable hole injection material and any suitable hole transport material available in the art may be respectively used.

In some embodiments, the hole transport region HTR may be on the first electrode EL1 in an opening portion defined on a pixel defining layer PDL and may extend to an upper portion of the pixel defining layer PDL. However, embodiments of the present disclosure not limited thereto. The hole transport region HTR may be patterned so as to be located inside the opening portion defined on the pixel defining layer PDL.

The light emitting layer EML is provided on the hole transport region HTR. The light emitting layer EML may have a single layer structure having a single layer formed of a single material, a single layer structure having a single layer formed of a plurality of different materials, or a multilayer structure having a plurality of layers formed of a plurality of different materials.

In the display device DS of an embodiment, the light emitting layer EML may be configured to emit blue light. The light emitting layer EML is not particularly limited as long as it is suitable and generally available in the art, and may include a fluorescent material or a phosphorescent material. In addition, the light emitting layer EML may include a host and a dopant. In FIG. 3, the light emitting layer EML is illustrated as being provided as a common layer for the entire (or substantially the entire) first light emitting region PXA-R, the second light emitting region PXA-G, and the third light emitting region PXA-B. However, embodiments of the present disclosure are not limited thereto. Unlike what is shown in FIG. 3, the light emitting layer EML may be inside the opening portion defined on the pixel defining layer PDL. For example, when the light emitting layer EML is separated by the pixel defining layer PDL, the light emitting layer EML corresponding to each light emitting region PXA-R, PXA-G, and PXA-B may be configured to emit light of the same (e.g., substantially the same) wavelength region or configured to emit light of different wavelength regions.

The electron transport region ETR is provided on the light emitting layer EML. The electron transport region ETR may include at least one selected from a hole blocking layer, an electron transport layer, and an electron injection layer, but is not limited thereto.

When the electron transport region ETR includes an electron injection layer and an electron transport layer, in the electron injection layer and the electron transport layer, any suitable electron injection material and any suitable electron transport material available in the art may be respectively used.

The second electrode EL2 is provided on the electron transport region ETR. The second electrode EL2 may be a common electrode and/or a cathode. The second electrode EL2 may be formed of a metal alloy and/or a conductive compound. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), and/or the like.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). In some embodiments, the second electrode EL2 may be of a multi-layered structure including a reflective film or a transflective film, both formed of the above exemplified materials, and a transparent conductive film formed of indium tin oxide (ITO), indium zinc oxide (IZO), zinc oxide (ZnO), indium tin zinc oxide (ITZO), and/or the like.

Referring to FIG. 3, the electron transport region ETR and the second electrode EL2 may be located not only in a region overlapping the first electrode EL1, but also on the pixel defining layer PDL by being further extended thereto. In some embodiments, the second electrode EL2 may be connected to an auxiliary electrode. When the second electrode EL2 is connected to the auxiliary electrode, the resistance of the second electrode EL2 may be reduced.

The display element layer DP-OEL may include a plurality of organic electroluminescent devices OEL. The plurality of organic electroluminescent devices OEL may be separated by the pixel defining layer PDL. For example, referring to FIG. 3, in an embodiment, the display element layer DP-OEL includes the first electrodes EL1 spaced apart from each other on a plane, and between the first electrodes EL1 spaced apart from each other, the pixel defining layer PDL may be provided. In some embodiments, in the display device DS according to an embodiment illustrated in FIG. 3, the plurality of organic electroluminescent devices OEL may be separated based on the first electrodes EL1 spaced apart from each other.

In the display panel DP according to an embodiment, each of the light emitting regions PXA-R, PXA-G, and PXA-B may be a region separated by the pixel defining layer PDL. The non-light emitting regions NPXA are regions between the light emitting regions PXA-R, PXA-G, and PXA-B and may be regions corresponding to the pixel defining layer PDL.

The pixel defining layer PDL may be formed of a polymer resin. For example, the pixel defining layer PDL may be formed by including a polyacrylate-based resin and/or a polyimide-based resin. Also, the pixel defining layer PDL may be formed by further including an inorganic material in addition to a polymer resin. In some embodiments, the pixel defining layer PDL may be formed by including a light absorbing material, and/or may be formed by including a black pigment and/or a black dye. The pixel defining layer PDL formed by including a black pigment and/or a black dye may implement a black pixel defining layer. When the pixel defining layer PDL is formed, carbon black and the like may be used as a black pigment and/or a black dye, but embodiments of the present disclosure are not limited thereto.

Also, the pixel defining layer PDL may include an inorganic material. For example, the pixel defining layer PDL may include silicon nitride (SiNx), silicon oxide (SiOx), silicon oxide (SiOxNy), and/or the like. The pixel defining layer PDL may define the light emitting regions PXA-R, PXA-G, and PXA-B. The light emitting regions PXA-R, PXA-G, and PXA-B and the non-light emitting region NPXA may be separated by the pixel defining layer PDL.

On the organic electroluminescent device OEL, the encapsulation layer TFE may be located, and the encapsulation layer TFE may be on the second electrode EL2. The encapsulation layer TFE may be directly on the second electrode EL2. The encapsulation layer TFE may be a single sub-layer or a plurality of sub-layers laminated. The encapsulation layer TFE may be a thin film encapsulating layer. The encapsulation layer TFE protects the organic electroluminescent device OEL. The encapsulation layer TFE may cover an upper surface of the second electrode EL2.

The color conversion layer CCL may be located on the display panel DP. The color conversion layer CCL may include a light converting body. The light converting body may be a quantum dot or a fluorescent body, and/or the like. The light converting body may be configured to wavelength-convert provided light and emit the same (e.g., substantially the same). For example, the color conversion layer CCL may be a layer including a quantum dot, and/or a layer including a fluorescent body.

The color conversion layer CCL may include a plurality of color conversion parts CCL1, CCL2, and CCL3. The color conversion parts CCL1, CCL2, and CCL3 may be spaced apart from each other.

Referring to FIG. 3, the light blocking part BM may be provided between the color conversion parts CCL1, CCL2, and CCL3 spaced apart from each other, but embodiments of the present disclosure are not limited thereto. In FIG. 3, the light blocking part BM is illustrated as not overlapping the color conversion parts CCL1, CCL2, and CCL3, but edges of the color conversion parts CCL1, CCL2, and CCL3 may overlap at least a portion of the light blocking part BM.

The color conversion layer CCL is on the display panel DP. For example, the color conversion layer CCL may be directly on the encapsulation layer TFE. However, embodiments of the present disclosure are not limited thereto. A barrier layer may be further between the encapsulation layer TFE and the color conversion layer CCL.

The barrier layer may serve to prevent or reduce the penetration of moisture and/or oxygen (hereinafter, referred to as 'moisture/oxygen'). The barrier layer may be on the color conversion layer CCL to prevent or reduce the exposure of the color conversion layer CCL to moisture/oxygen. In some embodiments, the barrier layer may cover the color conversion layer CCL. Also, the barrier layer may be provided between the color conversion layer CCL and the color filter layer CFL.

The barrier layer may include at least one inorganic layer. In some embodiments, the barrier layer may be formed by including an inorganic material. For example, the barrier layer may be formed by including silicon nitride, aluminum nitride, zirconium nitride, titanium nitride, hafnium nitride, tantalum nitride, silicon oxide, aluminum oxide, titanium oxide, tin oxide, cerium oxide and silicon oxynitride, and/or a metal thin film having light transmittance, and the like. In some embodiments, the barrier layer may further include an organic film. The barrier layer may be formed of a single layer or a plurality of layers.

The color conversion layer CCL may include a first color conversion part CCL1 including a first quantum dot QD1 configured to convert a first color light provided from the organic electroluminescent device OEL into a second color light, a second color conversion part CCL2 including a second quantum dot QD2 configured to convert the first color light into a third color light, and a third color conversion part CCL3 configured to transmit the first color light.

In an embodiment, the first color conversion part CCL1 may be configured to provide red light, which is the second color light, and the second color conversion part CCL2 may be configured to provide green light, which is the third color light. The third color conversion part CCL3 may be configured to transmit and provide blue light which is the first color light provided from the organic electroluminescent device OEL. For example, the first quantum dot QD1 may be a red quantum dot, and the second quantum dot QD2 may be a green quantum dot.

A quantum dot may be a particle configured to convert the wavelength of light provided from the display panel DP. A quantum dot is a material having a crystal structure of a few nanometers in size, and is composed of hundreds to thousands of atoms. Due to the small size thereof, a quantum dot exhibits a quantum confinement effect in which an energy band gap is increased. When light of a wavelength having higher energy than a band gap is incident on a quantum dot, the quantum dot is excited by absorbing the light and falls to a ground state by emitting light of a set or specific wavelength. The wavelength of the emitted light has a value corresponding to the band gap. When the size and composition of a quantum dot is adjusted, light emitting properties caused by the quantum confinement effect may be adjusted. Depending on the particle size of a quantum dot, the color of emitted light may be changed. The smaller the particle size of a quantum dot, light of the shorter wavelength region may be emitted. For example, the particle size of a quantum dot configured to emit green light may be smaller than the particle size of a quantum dot configured to emit red light.

A quantum dot may be selected from a Group II-VI compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof, and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The IV group compound may be a binary compound selected from the group consisting of SiC, SiGe, and a mixture thereof.

In some embodiments, a binary compound, a ternary compound, and/or a quaternary compound may be present in a particle with a uniform (e.g., substantially uniform) concentration distribution, or may be present in the same particle with a partially different concentration.

A quantum dot may have a core-shell structure in which a core and a shell surrounding the core are included. In addition, a quantum dot may have a core/shell structure in which one quantum dot surrounds another quantum dot. An interface between a core and a shell may have a concentration gradient in which the concentration of an element present in the shell becomes lower toward the center.

A quantum dot may be a particle having a size of nanometers. A quantum dot may have a full width of half maximum (FWHM) of a light emission wavelength spectrum of about 45 nm or less, for example, about 40 nm or less, or about 30 nm or less, and color purity or color reproducibility may be improved in the foregoing range. In addition, light emitted through such a quantum dot is emitted in all directions so that a wide viewing angle may be improved.

In addition, although the form of a quantum dot is not particularly limited as long as it is suitable and generally available in the art. For example, a quantum dot in the form of spherical, pyramidal, multi-arm, and/or cubic nanoparticles, nanotubes, nanowires, nanofibers, nanoparticles, and the like may be used.

The first color conversion part CCL1 may include a matrix part MX and the first quantum dot QD1 dispersed in the matrix part MX. The first color conversion part CCL1 may further include a scattering agent SP dispersed in the matrix part MX. The second color conversion part CCL2 may include the matrix part MX and the second quantum dot QD2 dispersed in the matrix part MX, and may further include the scattering agent SP. Also, the third color conversion part CCL3 may include the matrix part MX and the scattering agent SP.

The matrix part MX is a dispersing medium in which quantum dots QD1 and/or QD2 and/or the scattering agent SP is dispersed, and may be formed from a variety of resin compositions which may be referred to as a binder. The matrix part MX may be formed from a polymer resin composition. For example, the polymer resin composition forming the matrix part MX may include an acrylic resin, a urethane-based resin, a silicone-based resin, an epoxy resin, and/or the like. The polymer resin composition may be transparent.

The scattering agent SP may be an inorganic particle. For example, the scattering agent SP may include at least one selected from $TiO_2$, ZnO, $Al_2O_3$, $SiO_2$, and hollow silica. The scattering agent SP may include any one selected from $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first color conversion part CCL1 may correspond to the first light emitting region PXA-R, the second color conversion part CCL2 may correspond to the second light emitting region PXA-G, and the third color conversion part CCL3 may correspond to the third light emitting region PXA-B.

In the display device DS of an embodiment, the color filter layer CFL may be on the color conversion layer CCL. For example, the color filter layer CFL may be directly on the color conversion layer CCL. However, embodiments of the present disclosure are not limited thereto. A barrier layer may be further between the color conversion layer CCL and the color filter layer CFL. The barrier layer may include an inorganic layer.

The color filter layer CFL may include a plurality of filters. The color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter.

Each of the filters CF1, CF2, and CF3 may include a polymer photosensitive resin and a pigment or a dye. The first filter CF1 may include a red pigment and/or a red dye, the second filter CF2 may include a green pigment and/or a green dye, and the third filter CF3 may include a blue pigment and/or a blue dye.

Embodiments of the present disclosure, however, are not limited thereto. The third filter CF3 may not include a pigment or a dye. The third filter CF3 may include a polymer photosensitive resin but may not include a pigment or a dye. The third filter CF3 may be transparent. The third filter CF3 may be formed of a transparent photosensitive resin.

The display device DS of an embodiment includes the light blocking layer BML on the display panel DP. A main opening portion OH-M and a sub-opening portion OH-S may be defined on the light blocking layer BML. The light blocking layer BML may include the light blocking part BM, the main opening portion OH-M and the sub-opening portion OH-S. The light blocking part BM may be provided between the main opening portions OH-M, between the main opening portion OH-M and the sub-opening portion OH-S, and between the sub-opening portions OH-S.

The light blocking layer BML may be a black matrix. The light blocking layer BML may be formed by including an organic light blocking material and/or an inorganic light blocking material both including a black pigment and/or a black dye. The light blocking layer BML may prevent or reduce a light leakage phenomenon and distinguish the boundaries between the adjacent color conversion parts CCL1, CCL2, and CCL3, and/or overlap the boundaries between the adjacent filters CF1, CF2, and CF3.

The main opening portion OH-M may be defined corresponding to the light emitting region PXA. The main opening portion OH-M may be defined corresponding to each of the first light emitting region PXA-R, the second light emitting region PXA-G, and the third light emitting region, and PXA-B. The sub-opening portion OH-S may be defined corresponding to the non-light emitting region NPXA. The sub-opening portion OH-S may be defined corresponding to the first reflective region RA-R and the second reflective region RA-B.

A base substrate BS may be located on the color filter layer CFL. The base substrate BS may be a member that provides a base surface on which the color filter layer CFL, the light blocking layer BML, the color conversion layer CCL and/or the like are located. The base substrate BS may be a glass substrate, a metal substrate, a plastic substrate, and/or the like. However, embodiments of the present disclosure are not limited thereto, and the base substrate BS may be an inorganic layer, an organic layer, and/or a composite material layer.

FIG. 4 is a cross-sectional view of a portion of the display device DS of an embodiment. FIG. 4 may be a cross-sectional view of a portion including the first light emitting region PXA-R and the first reflective region RA-R which is adjacent thereto in the display device DS of an embodiment shown in FIG. 2.

A main exposure region OPA-M, which is a region defined by the main opening portion OH-M of the light blocking layer BML, may be a region corresponding to each of the first light emitting region PXA-R, the second light emitting region PXA-G, and the third light emitting region, and PXA-B. A sub-exposure region OPA-S defined by the sub-opening portion OH-S of the light blocking layer BML may be a region corresponding to the reflective region RA.

Referring to FIG. 4, the main opening portion OH-M may be defined to correspond to the first light emitting region PXA-R, and the sub-opening portion OH-S may be defined to correspond to the first reflective region RA-R.

The first filter CF1 may be provided on the first color conversion part CCL1 and the light blocking layer BML. The first filter CF1 may include a first main filter portion CF1-M, a first light blocking filter portion CF1-B, and a first sub-filter portion CF1-S.

The first main filter portion CF1-M may be located to correspond to the first light emitting region PXA-R, and the first sub-filter portion CF1-S and the first light blocking filter portion CF1-B may be located to correspond to the non-light emitting region NPXA. The main filter portion CF1-M may be a portion corresponding to the main opening portion OH-M, and the first sub-filter portion CF1-S may be a portion corresponding to the sub-opening portion OH-S. Also, the first light blocking filter portion CF1-B may be on the non-light emitting region NPXA, and may not overlap the sub-opening portion OH-S. FIG. 4 exemplarily shows a cross-section of the non-light emitting region NPXA including the first light emitting region PXA-R and the first reflective region RA-R, and the same may be applied to the non-light emitting region NPXA including the third light emitting region PXA-B and the second reflective region RA-B.

FIG. 5 is a plan view showing a portion of a display device corresponding to region AA of FIG. 2. FIG. 5 may be a plan view of a portion including the color filter layer CFL and the light blocking layer BML in the display device DS of an embodiment shown in FIG. 3.

Referring to FIG. 5, the main opening portion OH-M and the sub-opening portion OH-S may be defined on the light blocking layer BML. The remaining portion on which the main opening portion OH-M and the sub-opening portion OH-S are not defined may be the light blocking part BM.

When viewed on a plane defined by the first direction axis DR1 and the second direction axis DR2, in the main opening portion OH-M, main filter portions CF1-M, CF2-M, and CF3-M may be exposed, and in the sub-opening portion OH-S, sub-filter portions CF1-S and CF3-S may be exposed. In the present specification, the description that a filter portion is exposed means that the filter portion does not overlap the light blocking part BM.

The area of the first sub-filter portion CF1-S may be greater than 0% to 10% or less based on the total area of the first main filter portion CF1-M, the first light blocking filter portion CF1-B, and the first sub-filter portion CF1-S. In the display device DS of an embodiment, the area of the first filter CF1 exposed in the non-light emitting region NPXA may be adjusted to be greater than 0% to 10% or less based on 100% of the area of the entire (e.g., substantially the entire) display area DA to improve the reflective color sense in the display device DS of an embodiment.

Also, the area of a third sub-filter portion CF3-S may be greater than 0% to 10% or less based on the total area of a third main filter portion CF3-M, a third light blocking filter portion CF3-B, and a third sub-filter portion CF3-S. In the display device DS of an embodiment, the area of the third filter CF3 exposed in the non-light emitting region NPXA may be adjusted to improve the reflective color sense in the display device DS of an embodiment.

FIG. 6 is a cross-sectional view showing a portion corresponding to line of FIG. 2. FIG. 6 is a cross-sectional view showing a portion of the display device DS. In the cross-sectional view of FIG. 6, while a portion of the display device DS is shown, the configuration of the display panel DP is not further illustrated for convenience of explanation.

In the display device DS of an embodiment, the color conversion layer CCL may include the first color conversion part CCL1 located to correspond to the first light emitting region PXA-R, the second color conversion part CCL2 located to correspond to the second light emitting region PXA-G, and the third color conversion part CCL3 located to correspond to the third light emitting region PXA-B. Between the adjacent ones of the first color conversion part CCL1, the second color conversion part CCL2, and the third color conversion part CCL3, the light blocking part BM may be located.

On the color conversion layer CCL, the color filter layer CFL may be located. The color filter layer CFL may include the first filter CF1, the second filter CF2, and the third filter CF3. Boundaries BRL between the adjacent first filter CF1, second filter CF2, and third filter CF3 may overlap the light blocking part BM.

The first filter CF1 may include a first main filter portion CF1-M, a first light blocking filter portion CF1-B adjacent to the first main filter portion CF1-M, and a first sub-filter portion CF1-S spaced apart from the first main filter portion CF1-M. The third filter CF3 may include a third main filter portion CF3-M, a third light blocking filter portion CF3-B adjacent to the third main filter portion CF3-M, and a third sub-filter portion CF1-S spaced apart from the third main filter portion CF3-M.

In some embodiments, the second filter CF2 may include a second main filter portion CF2-M and a second light blocking filter portion CF2-B. The second light blocking filter portion CF2-B may be located adjacent to the second main filter portion CF2-M. The second filter CF2 may not include a sub-filter portion.

Each of the first main filter portion CF1-M, the second main filter portion CF2-M, and the third main filter portion CF3-M may be a portion corresponding to the first light emitting region PXA-R, the second light emitting region PXA-G, and the third light emitting region PXA-B, respectively. Each of the first sub-filter portion CF1-S and the third sub-filter portion CF3-S may be a portion corresponding to the first reflective region RA-R and the second reflective region RA-B, respectively.

The light blocking layer BML may include the light blocking part BM, the main opening portion OH-M and the sub-opening portion OH-S. The light blocking part BM may overlap the light blocking filter portions CF1-B, CF2-B, and CF3-B of the color filter layer CFL. The light blocking part BM may not overlap the main filter portions CF1-M, CF2-M, and CF3-M and the sub-filter portions CF1-S, CF2-S, and CF3-S of the color filter layer CFL.

Figure 7:
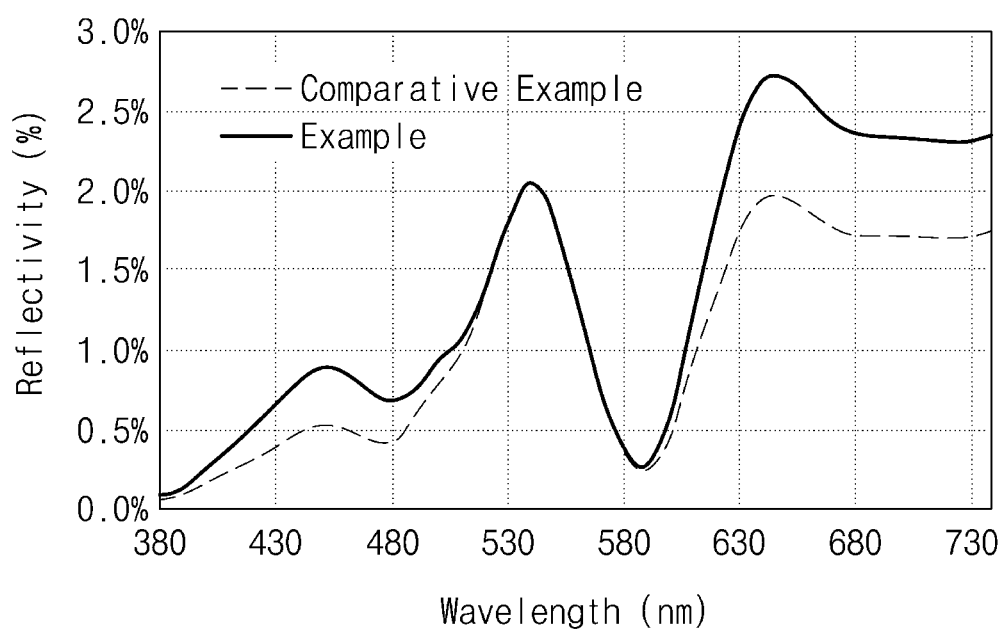
FIG. 7 is a graph showing reflectivity according to wavelengths in a display device according to an embodiment of the present disclosure.

FIG. 7 is a graph showing reflectivity evaluation results by wavelength for Comparative Example and Example. In FIG. 7, Example is an evaluation result for the display device DS of an embodiment having the structure of the cross-sectional view shown in FIG. 6, and the Comparative Example is an evaluation result for a case in which the sub-opening portion OH-S is not defined in the light blocking layer BML, unlike the display device DS of an embodiment shown in FIG. 6.

Referring to the graph of FIG. 7, the Example shows higher reflectivity than the Comparative Example in a wavelength region near 450 nm and a wavelength region near 650 nm. For example, referring to the results of FIG. 7, the Example shows increased reflectance in the blue light emitting region near 450 nm and in the red light emitting region near 650 nm, so that it can be seen that yellowish reflective color sense has been adjusted compared to a display device of the Comparative Example.

Table 1 shows results of comparing the display quality of display devices of Example and Comparative Example.

TABLE 1

| Classification | Example | | | Comparative Example | | |
|---|---|---|---|---|---|---|
| Light emitting region Area ratio (%) | First light emitting region 20 | Second light emitting region 15 | Third light emitting region 15 | First light emitting region 20 | Second light emitting region 15 | Third light emitting region 15 |
| Non-light emitting region area ratio (%) | First reflective region 0 | | Second reflective region 0 | First reflective region 8 | | Second reflective region 10 |
| SCE color coordinates (X, Y) | (0.305, 0.381) | | | (0.295, 0.313) | | |
| Reflectivity | 1.17% | | | 1.28% | | |

In Table 1, the area ratio of light emitting region represents the area ratio of each of light emitting regions when the total area of the display region DA (see FIG. 2) including the light emitting regions PXA-R, PXA-G, and PXA-B and the non-light emitting region NPXA is 100%. Also, the area ratio of non-light emitting region represents the ratio of the area of the filters CF1 and CF3 exposed in the non-light emitting region NPXA. For example, the area ratio of non-light emitting region represents the area ratio of each of the reflective region RA-R and RA-B, which are regions of filters exposed by the sub-opening portion OH-S, when the total area of the display region DA (see FIG. 2) including the light emitting regions PXA-R, PXA-G, and PXA-B and the non-light emitting region NPXA is 100%.

In the case of the Example, the reflectivity thereof was somewhat increased as compared with that of the Comparative Example. When compared with the Comparative Example, the area of the first reflective region RA-R and the area of the second reflective region RA-B were increased in the display device of the embodiment, so that SCE color coordinates (x,y) indicating reflective color sense were changed from (0.305, 0.381) to (0.295, 0.313). Therefore, it can be confirmed that reflective light having yellowish color sense was changed into reflective light having neutral color sense.

For example, in a display device of an embodiment, a portion of a color filter is exposed in a non-light emitting region due to a sub-opening portion defined in a light blocking layer in correspondence to the non-light emitting region, so that there may be an effect of improving reflective color sense caused by external light by light reflected from the exposed color filter. Also, the display quality of a display device may be improved by adjusting the area of the exposed color filter without changing the driving method of an organic electroluminescent device in a display panel.

Hereinafter, referring to FIG. 9 to FIG. 19, a display device of an embodiment will be described. In the description of a display device of an embodiment shown in FIG. 9 to FIG. 19, the same contents as those described above with reference to FIG. 1 to FIG. 6 will not be repeated here. Instead, the differences will be mainly described.

Figure 8:
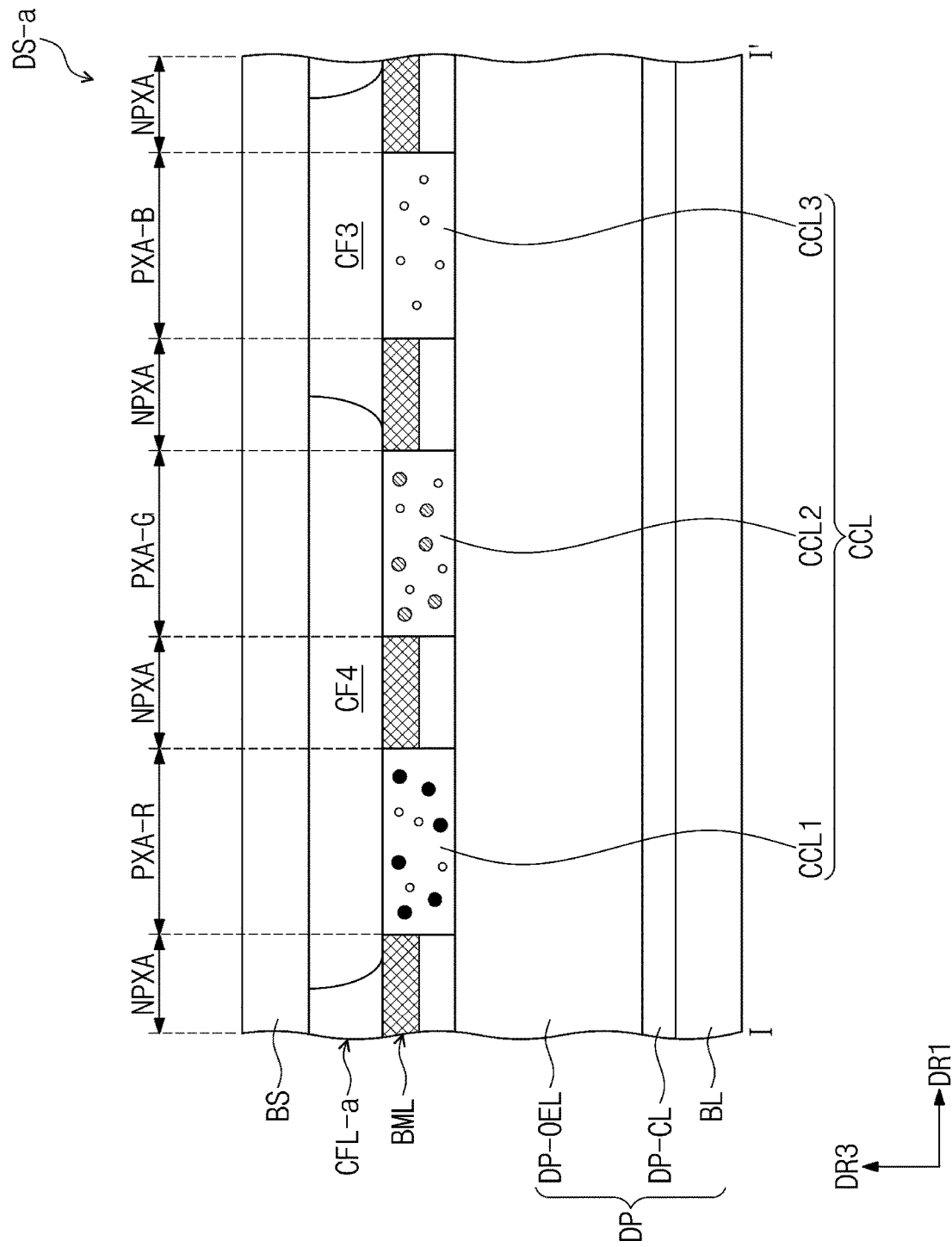
FIG. 8 is a cross-sectional view showing a display device according to an embodiment of the present disclosure.
Figure 9:
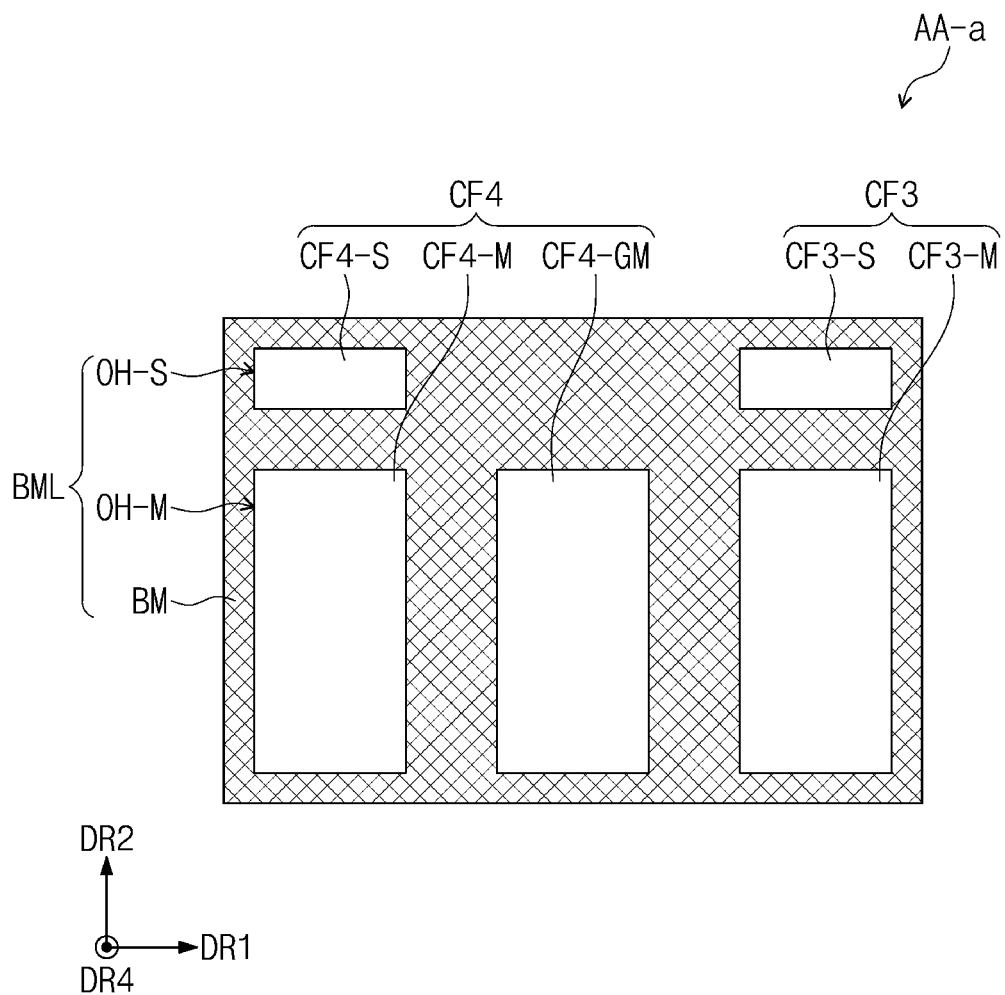
FIG. 9 is a plan view showing a portion of a display device according to an embodiment of the present disclosure.
Figure 10:
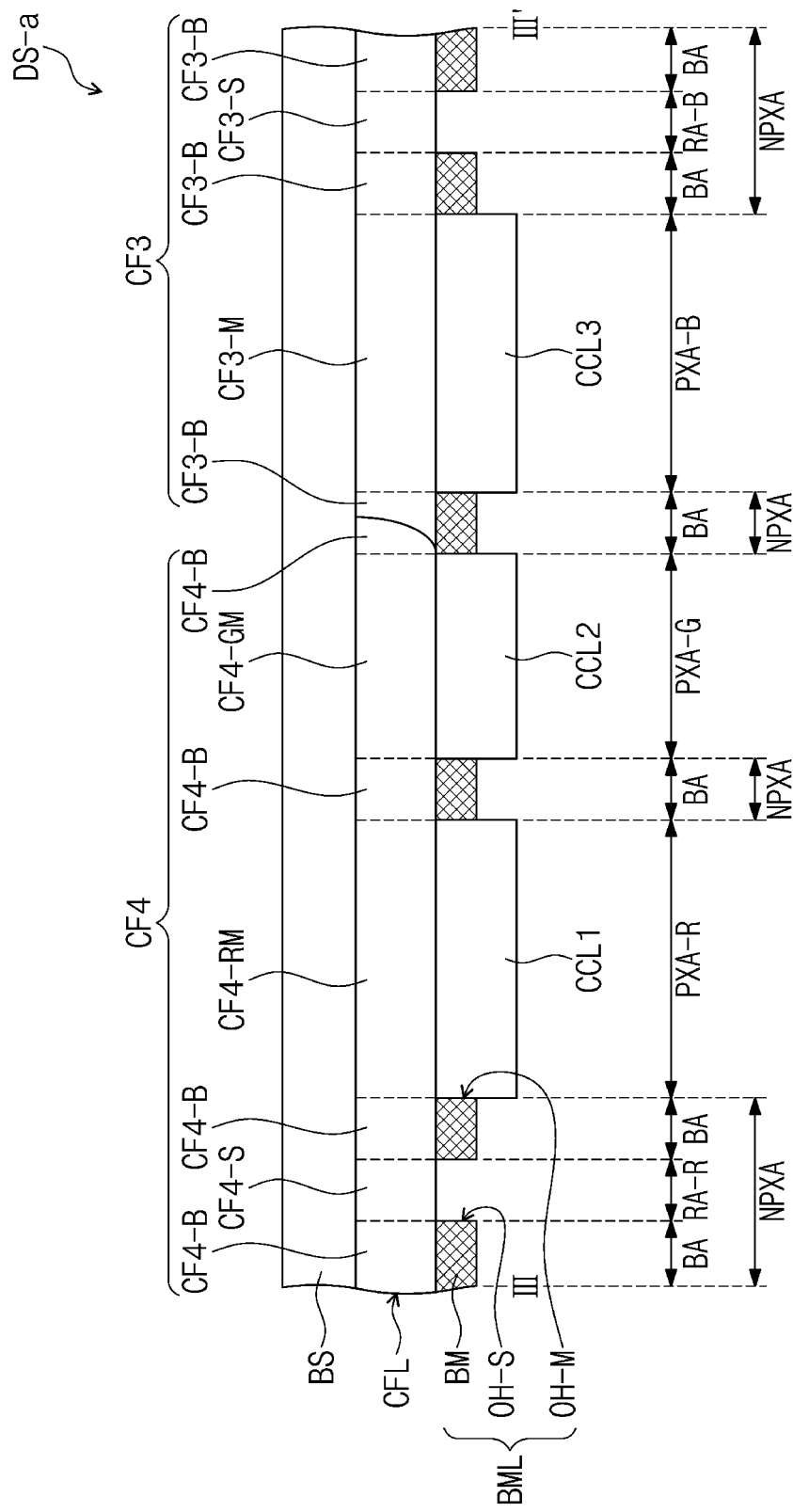
FIG. 10 is a cross-sectional view showing a portion of a display device according to an embodiment of the present disclosure.

FIG. 8 is a cross-sectional view showing a display device DS-a of an embodiment, FIG. 9 is a plan view showing a portion of a display device of an embodiment, and FIG. 10 is a cross-sectional view showing a portion of a display device of an embodiment.

FIG. 8 is a cross-sectional view showing a portion of the display device DS-a of an embodiment corresponding to the cross-section of the display device DS of an embodiment illustrated in FIG. 3. The display device DS-a of an embodiment illustrated in FIG. 8 includes a display panel DP, a color conversion layer CCL on the display panel DP, a light blocking layer BML on the display panel DP, and a color filter layer CFL-a on the color conversion layer CCL.

In the display device DS-a according to an embodiment of the present disclosure illustrated in FIG. 8, the same contents as those described above with reference to FIG. 3 may be applied to the display panel DP, the color conversion layer CCL, and the light blocking layer BML. In the display device DS-a according to an embodiment, the color conversion layer CCL may include a first color conversion part CCL1, a second color conversion part CCL2, and a third color conversion part CCL3.

In an embodiment, the color filter layer CFL-a may include a third filter CF3 and a fourth filter CF4. The third filter CF3 may overlap a third color conversion part CCL3, and the fourth filter CF4 may overlap a first color conversion part CCL1 and a second color conversion part CCL2.

The third filter CF3 may be configured to transmit blue light, which is a first color light. The third filter CF3 may include a blue pigment. Also, in some embodiments, the third filter CF3 may be a transparent filter.

The fourth filter CF4 may be configured to transmit a fourth color light. The fourth color light may be yellow light. For example, the fourth filter CF4 may be a yellow filter. The fourth filter CF4 may overlap and be provided integrally with the first color conversion part CCL1 and the second color conversion part CCL2 (e.g., are integral with one another, for example, are formed as a single piece).

FIG. 9 is a plan view showing a portion of the display device DS-a according to an embodiment illustrated in FIG. 8. FIG. 9 is a plan view showing a portion AA-a of the display device DS-a of an embodiment corresponding to a portion of the display device DS of an embodiment illustrated in FIG. 5.

Referring to FIG. 9, on the light blocking layer BML, the main opening portion OH-M and the sub-opening portion OH-S may be defined. When viewed on a plane defined by a first direction axis DR1 and a second direction axis DR2, in the main opening portion OH-M, main filter portions CF4-RM, CF4-GM, and CF3-M may be exposed, and in the sub-opening portion OH-S, sub-filter portions CF4-S and CF3-S may be exposed.

Fourth main filter portions CF4-RM and CF4-GM not overlapping the light blocking part BM and exposed in the main opening portion OH-M may be yellow filters. Third main filter portion CF3-M not overlapping the light blocking part BM and exposed in the main opening portion OH-M may be a blue filter.

Also, a fourth sub-filter portion CF4-S not overlapping the light blocking part BM and exposed in the sub-opening portion OH-S may be a yellow filter, and a third sub-filter portion CF3-S not overlapping the light blocking part BM and exposed in the sub-opening portion OH-S may be a blue filter.

FIG. 10 is a cross-sectional view showing a portion of the display device DS-a according to an embodiment illustrated in FIG. 8. FIG. 10 is a cross-sectional view showing a portion of the display device DS-a of an embodiment corresponding to the display device DS of an embodiment illustrated in FIG. 6. In the cross-sectional view of FIG. 10, while a portion of the display device DS-a is shown, the configuration of the display panel DP is not further illustrated for convenience of explanation.

When comparing the display device DS-a of an embodiment illustrated in FIG. 10 with the display device DS of an embodiment illustrated in FIG. 6 described above, there is a difference in the configuration of the color filter layer CFL-a. Referring to FIG. 10, the fourth filter CF4 may include the fourth main filter portions CF4-RM and CF4-GM, a fourth light blocking filter portion CF4-B adjacent to the fourth main filter portions CF4-RM and CF4-GM, and the fourth sub-filter portion CF4-S spaced apart from the fourth main filter portion CF4-RM.

The fourth main filter portions CF4-RM and CF4-GM may be portions corresponding to the first light emitting region PXA-R and the second light emitting region PXA-G. The fourth sub-filter portion CF4-S may be a portion corresponding to the sub-opening portion OH-S defined in the light blocking layer BML.

In the display device DS-a of an embodiment illustrated in FIG. 10, the third filter CF3 may include the third main filter portion CF3-M, the third light blocking filter portion CF3-B adjacent to the third main filter portion CF3-M, and the third sub-filter portion CF3-S spaced apart from the third main filter portion CF3-M. The third main filter portion CF3-M may be a portion corresponding to the third light emitting region PXA-B. The third sub-filter portion CF3-S may be a portion corresponding to the sub-opening portion OH-S defined in the light blocking layer BML.

The same contents as those described for the display device DS of an embodiment with reference to FIG. 3 may be applied to the color conversion parts CCL1, CCL2, and CCL3 in the display device DS-a of an embodiment illustrated in FIG. 10.

Figure 11:
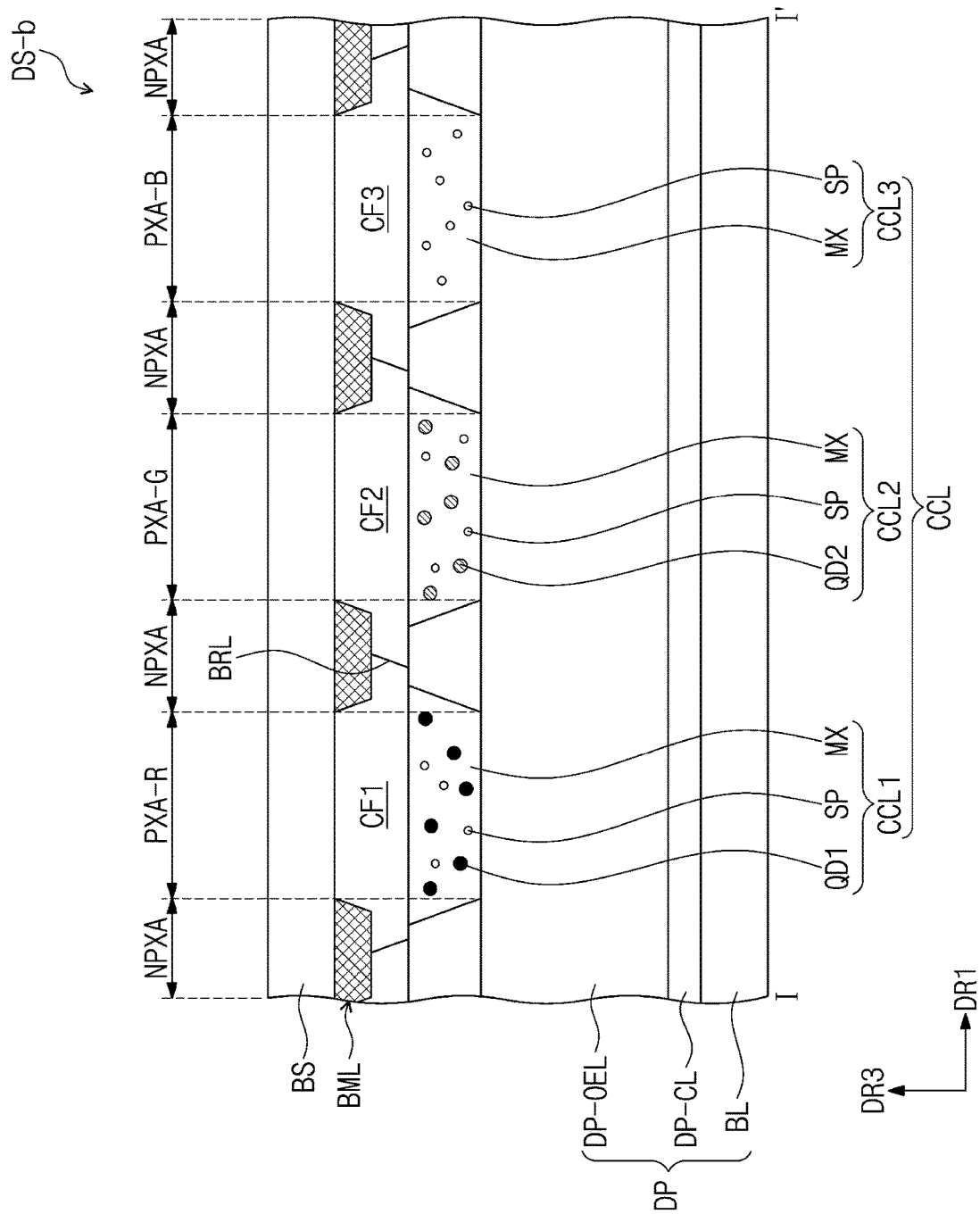
FIG. 11 is a cross-sectional view showing a display device according to an embodiment of the present disclosure.
Figure 12:
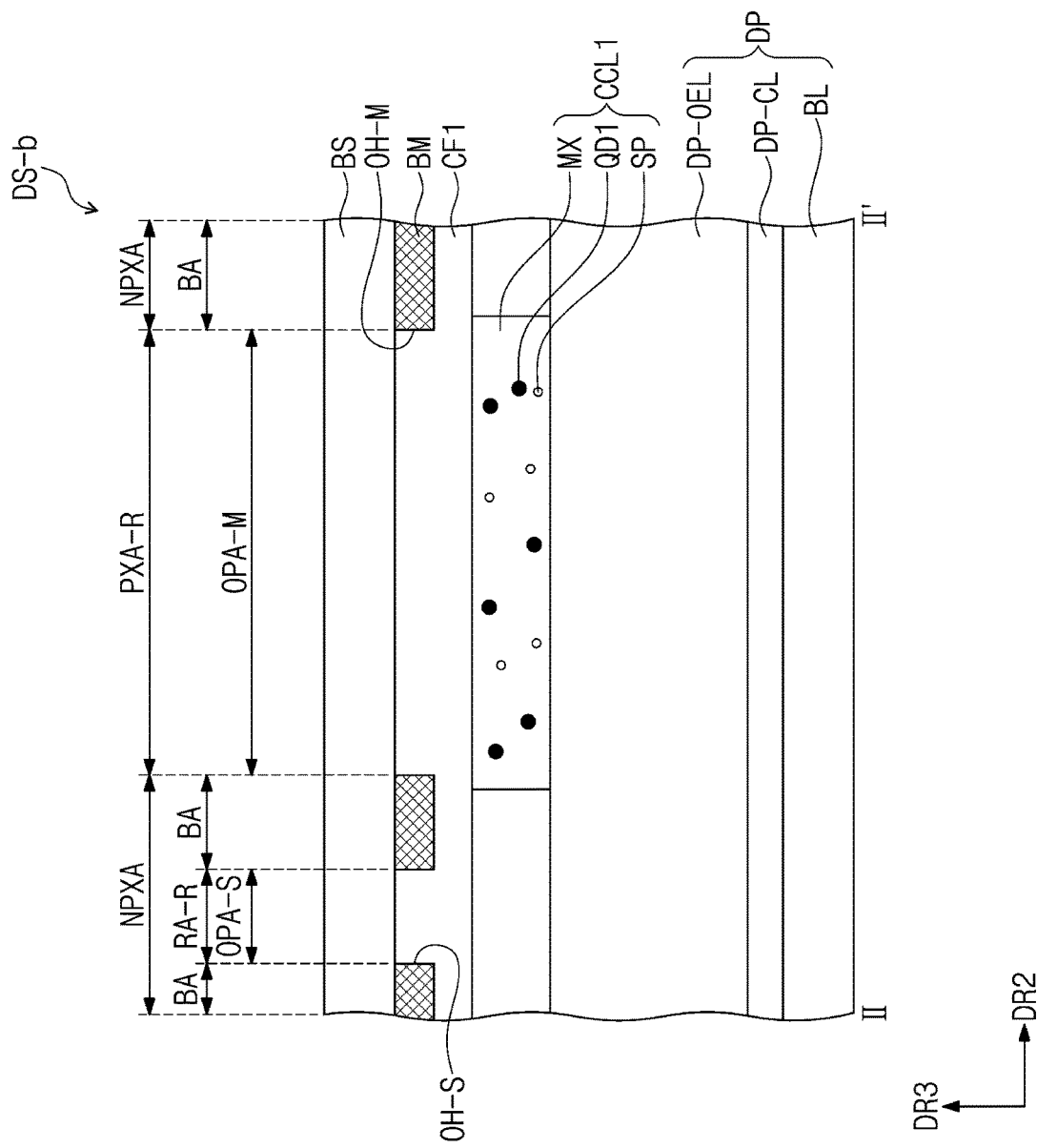
FIG. 12 is a cross-sectional view showing a portion of a display device according to an embodiment of the present disclosure.
Figure 13:
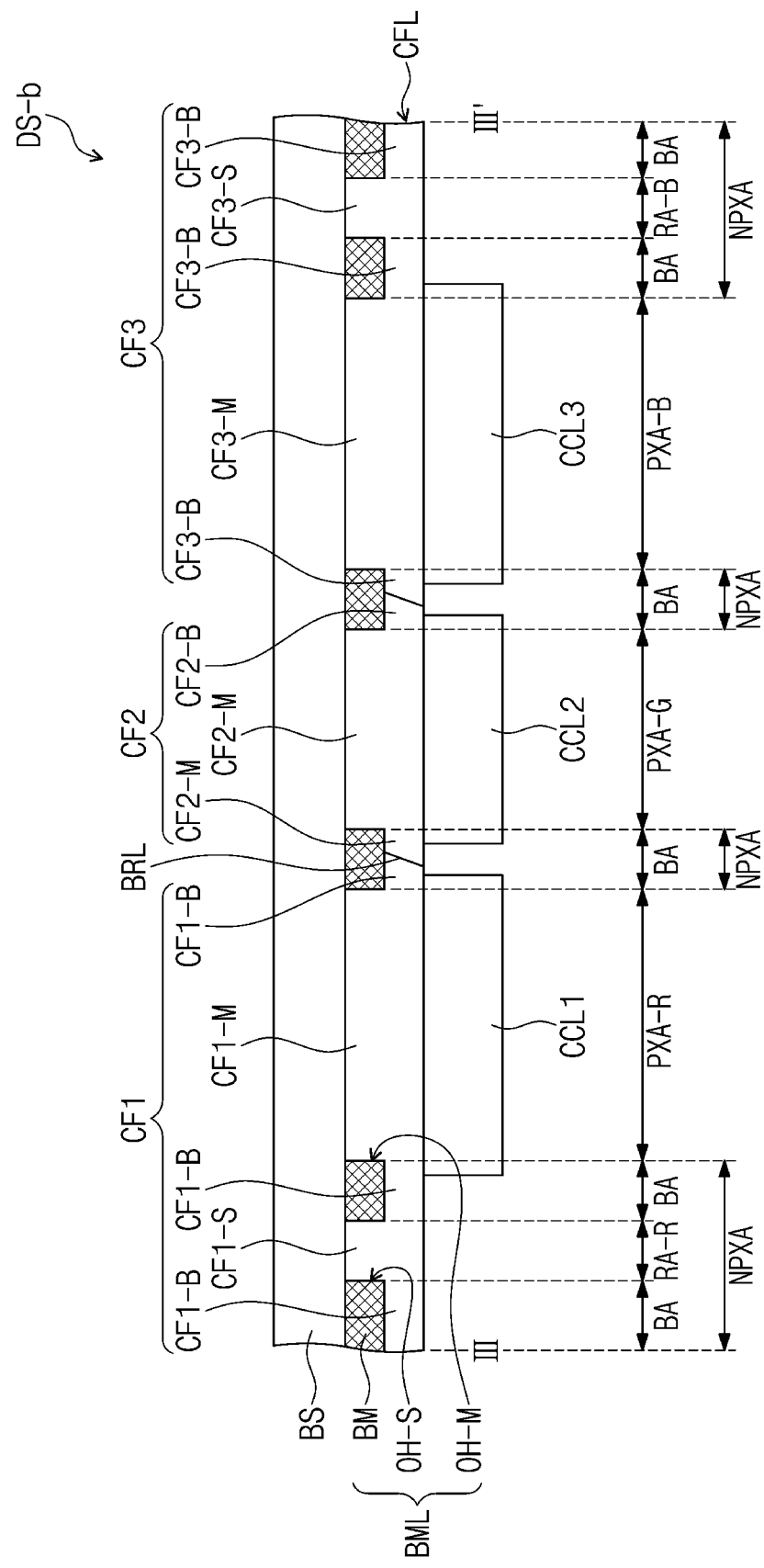
FIG. 13 is a cross-sectional view showing a portion of a display device according to an embodiment of the present disclosure.

FIG. 11 is a cross-sectional view showing a display device DS-b of an embodiment, and FIG. 12 and FIG. 13 are cross-sectional views showing a portion of the display device DS-b of an embodiment, respectively. In the cross-sectional view of FIG. 13, while a portion of the display device DS-b is shown, the configuration of a display panel DP is not further illustrated for convenience of explanation.

The display device DS-b of an embodiment illustrated in FIG. 11 to FIG. 13 includes the display panel DP, a color conversion layer CCL on the display panel DP, a light blocking layer BML on the display panel DP, and a color filter layer CFL on the color conversion layer CCL. In the display device DS-b of an embodiment, the light blocking layer BML may be provided above the color conversion layer CCL. For example, when compared with the display device DS of an embodiment described with reference to FIG. 3 to FIG. 6, the light blocking layer BML is located adjacent to a base substrate BS in the display device DS-b of an embodiment illustrated in FIG. 11 to FIG. 13. A blocking unit BM of the light blocking layer BML may be between filters CF1, CF2, and CF3. Also, the light blocking layer BML may be covered by the color filter layer CFL.

Referring to the cross-sectional views of FIG. 12 and FIG. 13, in the display device DS-b of an embodiment, the color conversion layer CCL may be above the display panel DP, the color filter layer CFL may be above the color conversion layer CCL, and the light blocking layer BML may be above the color filter layer CFL.

In the display device DS-b of an embodiment, the color conversion layer CCL may include a first color conversion part CCL1 located to correspond to a first light emitting region PXA-R, a second color conversion part CCL2 located to correspond to a second light emitting region PXA-G, and a third color conversion part CCL3 located to correspond to a third light emitting region PXA-B.

On the color conversion layer CCL, the color filter layer CFL may be located. The color filter layer CFL may include the first filter CF1, the second filter CF2, and the third filter CF3. Boundaries BRL between the adjacent ones of the first filter CF1, the second filter CF2, and the third filter CF3 may overlap the light blocking part BM.

The first filter CF1 may include a first main filter portion CF1-M, a first light blocking filter portion CF1-B adjacent to the first main filter portion CF1-M, and a first sub-filter portion CF1-S spaced apart from the first main filter portion CF1-M. The third filter CF3 may include a third main filter portion CF3-M, a third light blocking filter portion CF3-B adjacent to the third main filter portion CF3-M, and a third sub-filter portion CF1-S spaced apart from the third main filter portion CF3-M.

The second filter CF2 may include a second main filter portion CF2-M and a second light blocking filter portion CF2-B. The second light blocking filter portion CF2-B may be adjacent to the second main filter portion CF2-M. The second filter CF2 may not include a sub-filter portion.

The light blocking layer BML may include the light blocking part BM, a main opening portion OH-M and a sub-opening portion OH-S. The light blocking part BM may overlap the light blocking filter portions CF1-B, CF2-B, and CF3-B of the color filter layer CFL. The light blocking part BM may not overlap the main filter portions CF1-M, CF2-M, and CF3-M and the sub-filter portions CF1-S, CF2-S, and CF3-S of the color filter layer CFL. The light blocking part BM may be between the main filter portions CF1-M, CF2-M, and CF3-M and between the main filter portions CF1-M and CF3-M and the sub-filter portions CF1-S and CF3-S.

A method for manufacturing the display device DS-b of an embodiment, as illustrated in FIG. 11 to FIG. 13, may be, for example, carried out in the order of forming the light blocking layer BML on the base substrate BS and forming the color filter layer CFL on the provided light blocking layer BML. For example, a light blocking material may be provided on the base substrate BS to form the light blocking layer BML having the main opening portion OH-M and the sub-opening portion OH-S defined thereon, and then a plurality of filters CF1, CF2, CF3 may be sequentially provided to form the color filter layer CFL.

In some embodiments, a method for manufacturing the display device DS of an embodiment described with reference to FIG. 3 to FIG. 6 may be carried out in the order of forming the color filter layer CFL on the base substrate BS, forming the light blocking layer BML on the color filter layer CFL, and then forming the color conversion layer CCL on the color filter layer CFL. For example, the plurality of filters CF1, CF2, CF3 may be sequentially provided on the base substrate BS to form the color filter layer CFL, and then a light blocking material may be provided on the color filter layer CFL and the main opening portion OH-M and the sub-opening portion OH-S may be defined to form the light blocking layer BML. Thereafter, a first color conversion part CCL1, a second color conversion part CCL2, and a third color conversion parts CCL1, CCL2, and CCL3 may be formed between the light blocking parts BM.

The methods for manufacturing the display devices DS and DS-b of an embodiment described above are only exemplary, and the manufacturing methods are not limited thereto.

Figure 14:
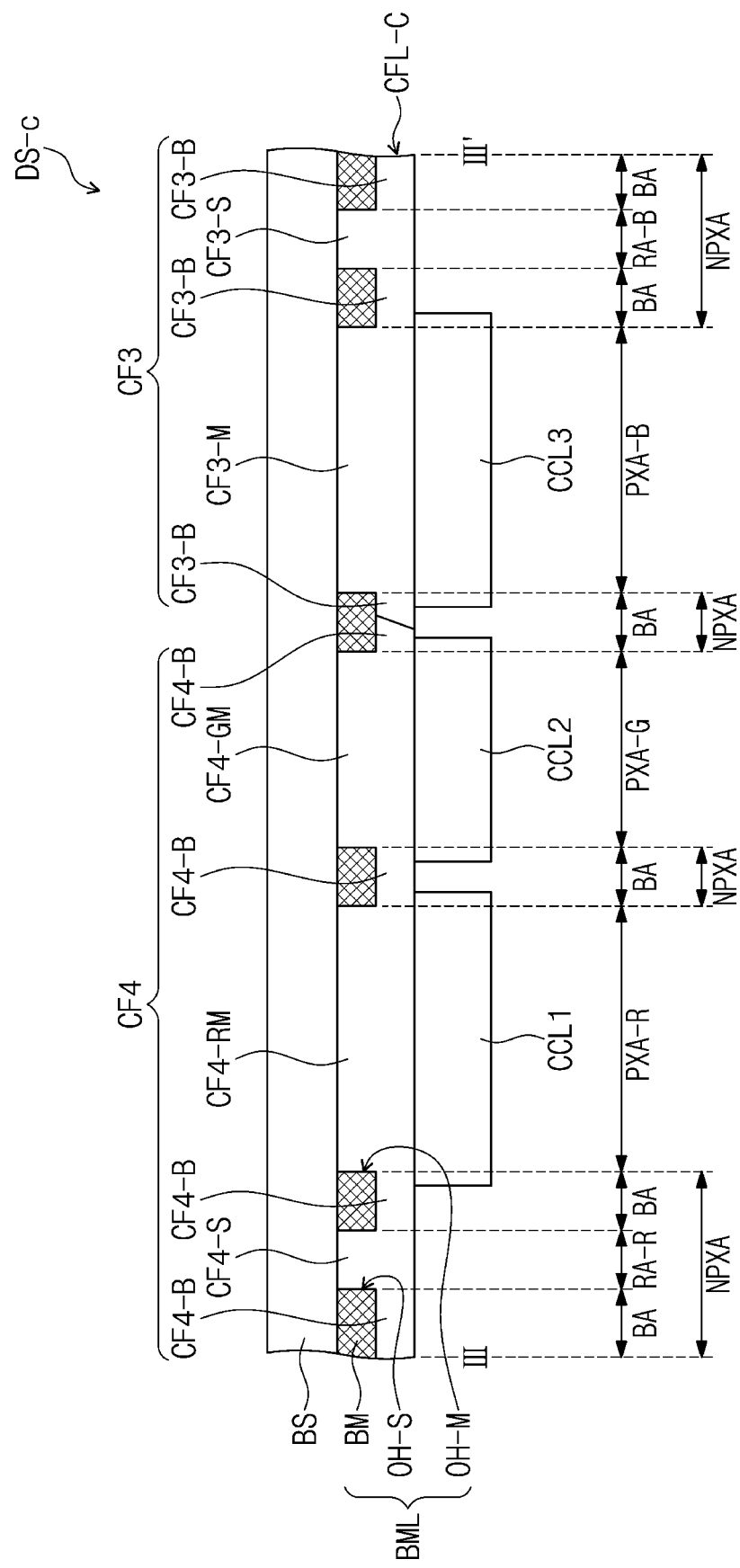
FIG. 14 is a cross-sectional view showing a portion of a display device according to an embodiment of the present disclosure.

FIG. 14 is a cross-sectional view showing a display device DS-c of an embodiment. When comparing the display device DS-c of an embodiment illustrated in FIG. 14 with the display device DS-b of an embodiment illustrated in FIG. 13, there is a difference in the configuration of the color filter layer CFL-C.

In the display device DS-c of an embodiment illustrated in FIG. 14, the color filter layer CFL-C may include a third filter CF3 and a fourth filter CF4. The third filter CF3 may overlap a third color conversion part CCL3, and the fourth filter CF4 may overlap a first color conversion part CCL1 and a second color conversion part CCL2.

The third filter CF3 may be configured to transmit blue light, which is a first color light. The third filter CF3 may include a blue pigment. Also, in some embodiments, the third filter CF3 may be a transparent filter. The fourth filter CF4 may be configured to transmit a fourth color light. The fourth color light may be yellow light. For example, the fourth filter CF4 may be a yellow filter. The fourth filter CF4 may overlap and be provided integrally with the first color conversion part CCL1 and the second color conversion part CCL2 (e.g., are integral with one another, for example, are formed as a single piece).

A main opening portion OH-M and a sub-opening portion OH-S may be defined on the light blocking layer BML. A light blocking part BM may be provided between the main opening portions OH-M and between the main opening portion OH-M and the sub-opening portion OH-S.

The fourth filter CF4 may include fourth main filter portions CF4-RM and CF4-GM not overlapping the light blocking part BM and exposed in the main opening portion OH-M, fourth sub-filter portions CF4-S not overlapping the light blocking part BM and exposed in the sub-opening portion OH-S, and fourth light blocking filter portions CF4-B overlapping the light blocking part BM.

The third filter CF3 may include a third main filter portion CF3-M not overlapping the light blocking part BM and exposed in the main opening portion OH-M, a third sub-filter portion CF3-S not overlapping the light blocking part BM and exposed in the sub-opening portion OH-S, and a third light blocking filter portions CF3-B overlapping the light blocking part BM.

Figure 15:
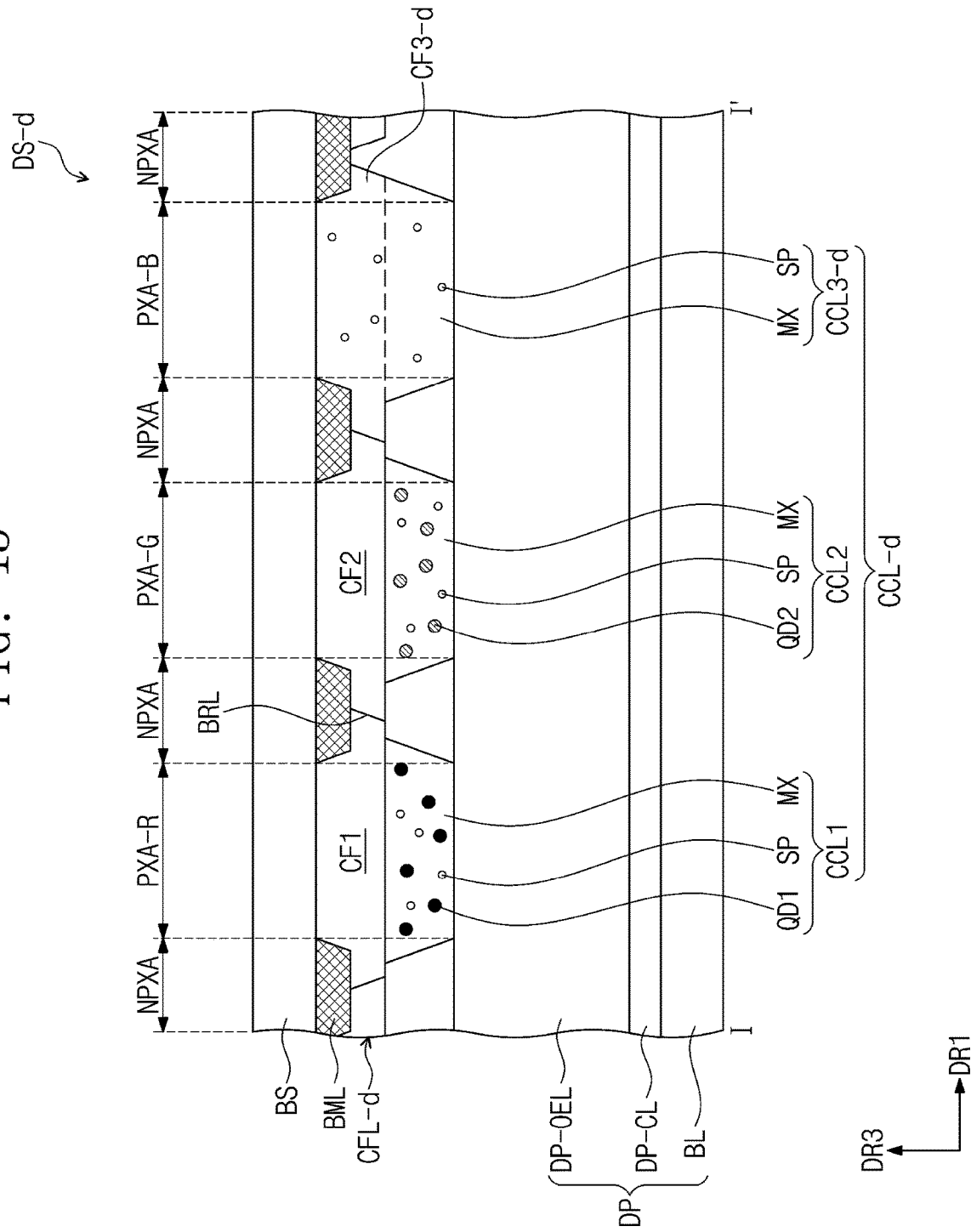
FIG. 15 is a cross-sectional view showing a display device according to an embodiment of the present disclosure.
Figure 16:
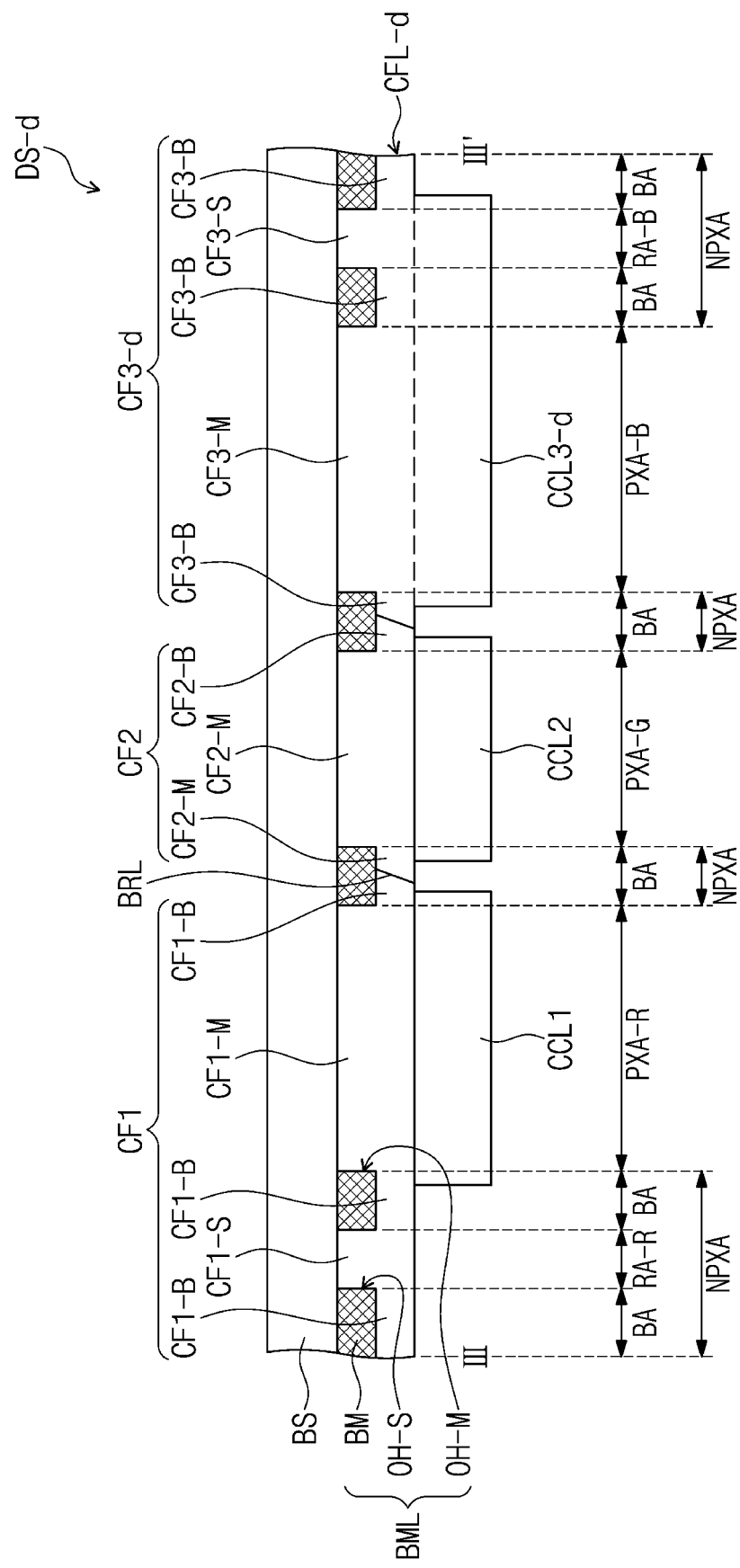
FIG. 16 is a cross-sectional view showing a display device according to an embodiment of the present disclosure.

FIG. 15 and FIG. 16 are each a cross-sectional view showing a display device DS-d according to an embodiment. FIG. 15 is a cross-sectional view showing the display device DS-d of an embodiment corresponding to the cross-section of the display device DS of an embodiment illustrated in FIG. 3, and FIG. 16 is a cross-sectional view showing a portion corresponding to the cross-section of the display device DS of an embodiment illustrated in FIG. 6. The display device DS-d of an embodiment illustrated in FIG. 15 and FIG. 16 includes a display panel DP, a color conversion layer CCL-d on the display panel DP, a color filter layer CFL-d on the color conversion layer CCL-d, and a light blocking layer BML on the color conversion layer CCL-d.

The same contents as those described with reference to FIG. 3 to FIG. 6 may be applied to the display panel DP. The display panel DP includes a display element layer DP-OEL, and the display panel DP may be configured to provide a first color light emitted from the display element layer DP-OEL to the color conversion layer CCL-d.

The color conversion layer CCL-d may include a first color conversion part CCL1, a second color conversion part CCL2, and a third color conversion part CCL3-d. The first color conversion part CCL1 may include a first quantum dot QD1 configured to convert the first color light into a second color light and the second color conversion part CCL2 may include a second quantum dot QD2 configured to convert the first color light into the third color light. The third color conversion part CCL3-d may be configured to transmit the first color light. The first color conversion part CCL1, the second color conversion part CCL2, and the third color conversion part CCL3-d may further include a scattering agent SP.

The display device DS-d of an embodiment includes a color filter layer CFL-d having the first filter CF1 and the second filter CF2. In an embodiment, the first filter CF1 may be a red filter, and the second filter CF2 may be a green filter.

The color filter layer CFL-d includes a third filter CF3-d, and in an embodiment, the third filter CF3-d and the third color conversion parts CCL3-d may be integrally provided (e.g., may be integral with one another, for example, may be formed as a single piece). The third filter CF3-d and the third color conversion parts CCL3-d may include a matrix part MX and the scattering agent SP dispersed in the matrix part MX. Also, the third filter CF3-d and the third color conversion parts CCL3-d which are integrally provided (e.g., are integral with one another, for example, are formed as a single piece) may further include a blue pigment.

The third filter CF3-d which is integrally provided with the third color conversion part CCL3-d (e.g., are integral with one another, for example, are formed as a single piece) may include a third main filter portion CF3-M, a third sub-filter portion CF3-S, and a third light blocking filter portion CF3-B. The same contents as those described reference to FIG. 3 to FIG. 6 may be applied to the first filter CF1 and the second filter CF2.

Figure 17:
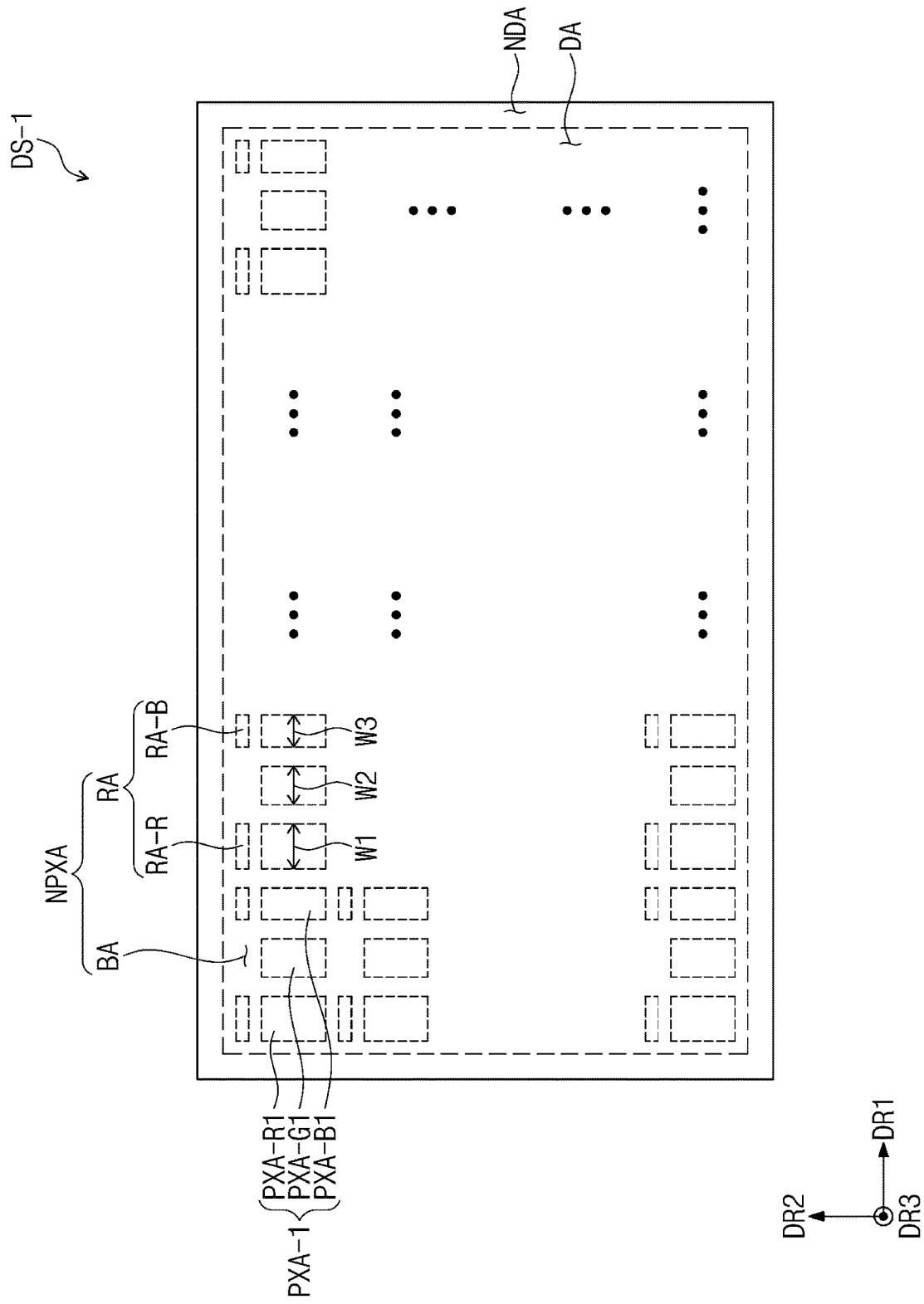
FIG. 17 is a plan view of a display device according to an embodiment of the present disclosure.
Figure 18:
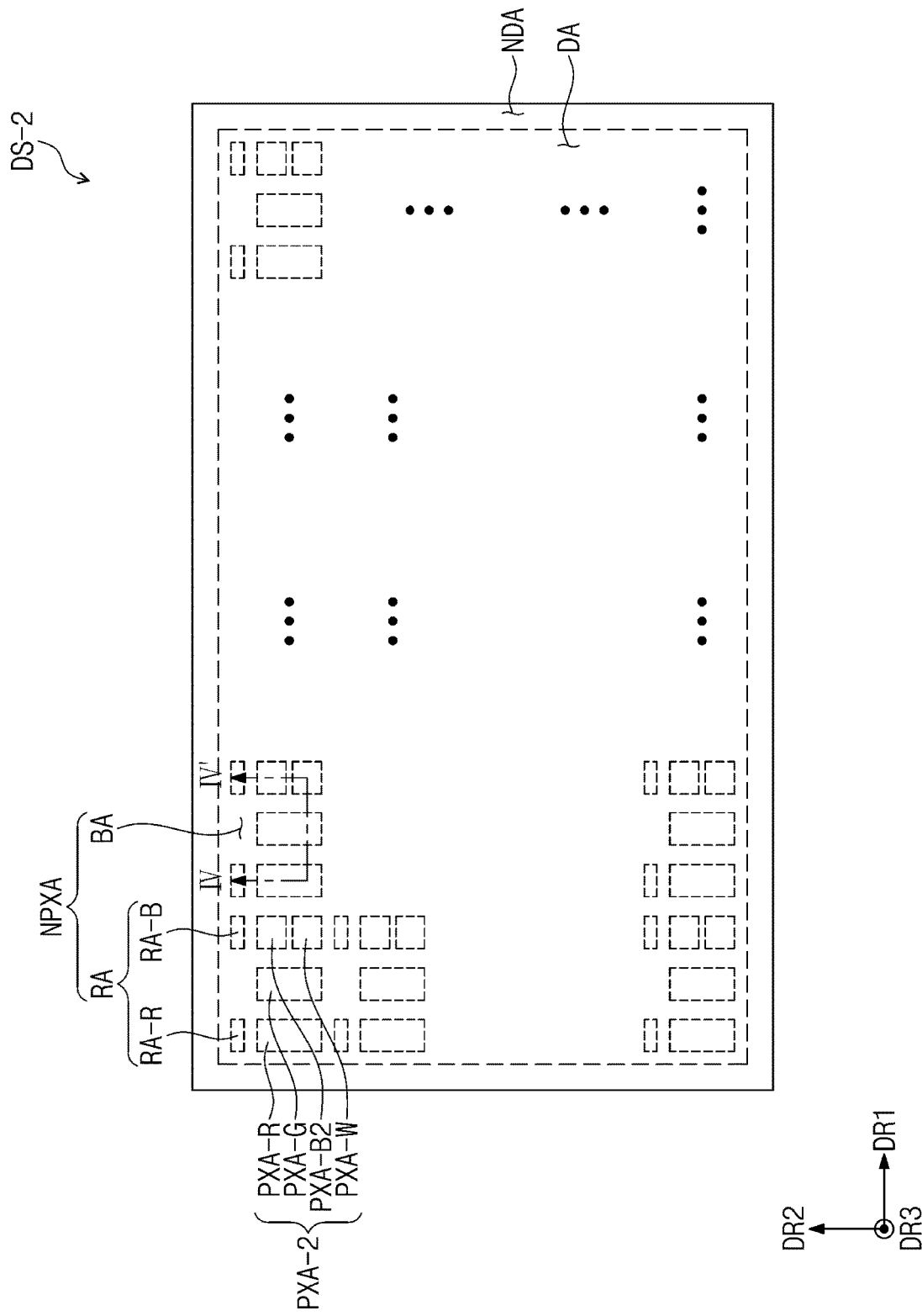
FIG. 18 is a plan view of a display device according to an embodiment of the present disclosure.
Figure 19:
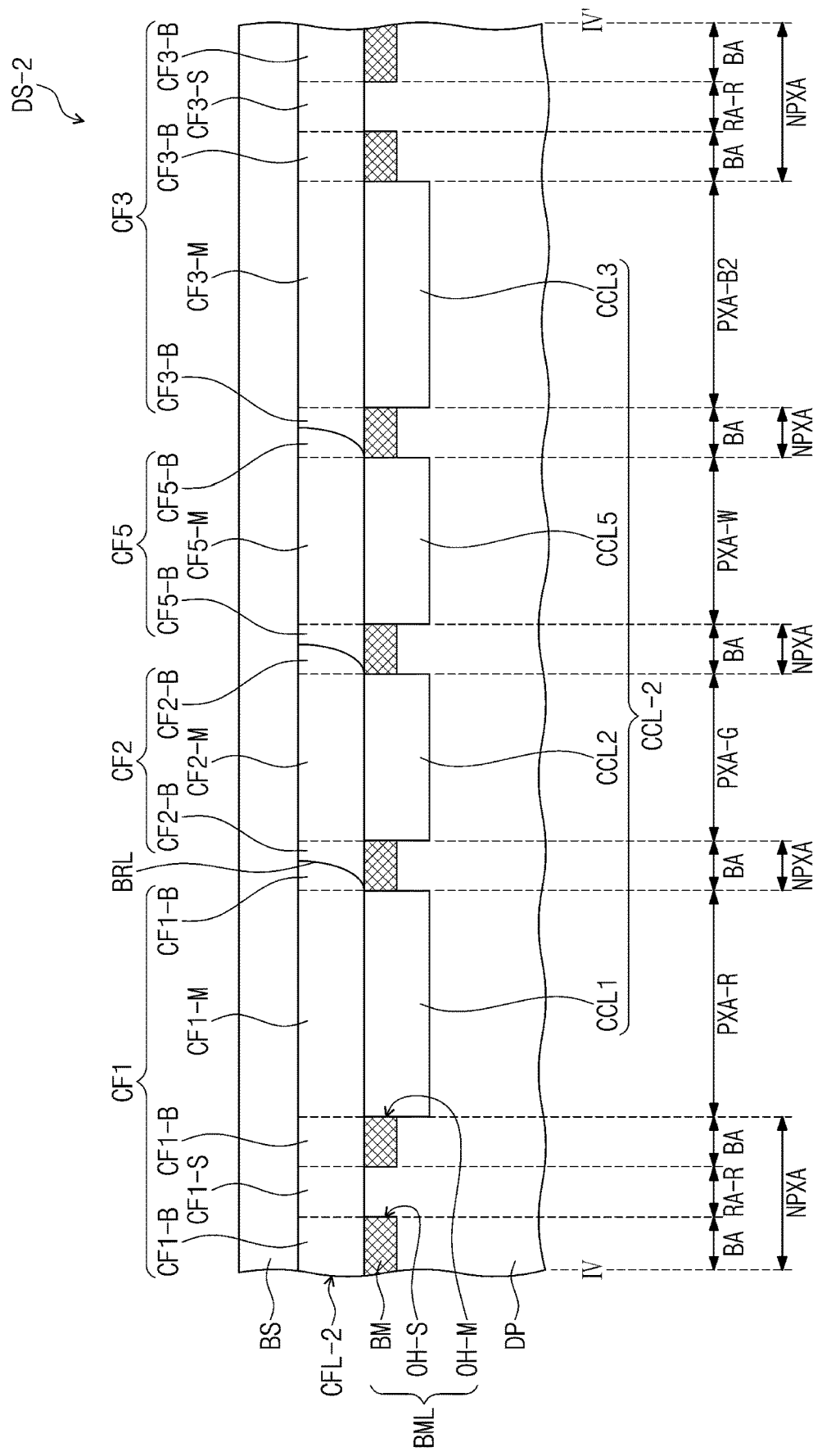
FIG. 19 is a cross-sectional view showing a display device according to an embodiment of the present disclosure.

FIG. 17 and FIG. 18 are each a plan view showing display devices DS-1 and DS-2 according to an embodiment. FIG. 19 is a cross-sectional view showing a portion of a display device of an embodiment corresponding to line IV-IV' of FIG. 18.

When comparing the display devices DS-1 and DS-2 of an embodiment illustrated in FIG. 17 and FIG. 18 with the display device DS described above with reference to FIG. 2 and the like, there is a difference in the configuration of a light emitting region.

Referring to FIG. 17, the display device DS-1 of an embodiment may include a light emitting region PXA-1 and a non-light emitting region NPXA adjacent thereto. The non-light emitting region NPXA may include a reflective region RA and a light blocking region BA.

The light emitting region PXA-1 includes a first light emitting region PXA-R1, a second light emitting region PXA-G1, and a third light emitting region PXA-B1. In the display device DS-1 of an embodiment, the respective areas of the first light emitting region PXA-R1, the second light emitting region PXA-G1, and the third light emitting region PXA-B1 may be different from each other. In the present specification, the area of a light emitting region may represent the area on a plane defined by a first direction axis DR1 and a second direction axis DR2.

In the display device DS-1 of an embodiment illustrated in FIG. 17, the area of the first light emitting region PXA-R1 may be greater than the area of each of the second light emitting region PXA-G1 and the third light emitting region PXA-B1. Also, in the display device DS-1 of an embodiment, the area of the first light emitting region PXA-R1 may be greater than the area of the second light emitting region PXA-G1, and the area of the second light emitting region PXA-G1 may be greater than the area of the third light emitting region PXA-B1.

A width W1 of the first light emitting region PXA-R1 in the first direction axis DR1 direction may be greater than a width W2 of the second light emitting region PXA-G1 in the first direction axis DR1 direction and a width W3 of the third light emitting region PXA-B1 in the first direction axis DR1 direction. Also, the width W1 of the first light emitting region PXA-R1 in the first direction axis DR1 direction may be greater than the width W2 of the second light emitting region PXA-G1 in the first direction axis DR1 direction, and the width W2 of the second light emitting region PXA-G1 in the first direction axis DR1 direction may be greater than the width W3 of the third light emitting region PXA-B1 in the first direction axis DR1 direction.

For example, in the display device DS-1 of an embodiment, the area of a red light emitting region which is the first light emitting region PXA-R may be greater than the area of a green light emitting region which is the second light emitting region PXA-G and the area of a blue light emitting region which is the third light emitting region PXA-B.

However, the area ratio of the first light emitting region PXA-R1, the second light emitting region PXA-G1, and the third light emitting region PXA-B1 is not limited to that illustrated in FIG. 17. The area ratio of the first light emitting region PXA-R1, the second light emitting region PXA-G1, and the third light emitting region PXA-B1 may be variously adjusted according to display color sense desired or required in the display device DS-1 of an embodiment.

Referring to FIG. 18, the display device DS-2 of an embodiment includes a light emitting region PXA-2 and the non-light emitting region NPXA adjacent thereto. The non-light emitting region NPXA may include a reflective region RA and a light blocking region BA.

The light emitting region PXA-2 includes a first light emitting region PXA-R, a second light emitting region PXA-G, a third light emitting region PXA-B2, and a fourth light emitting region PXA-W. When compared to the display device DS of an embodiment illustrated in FIG. 2, the display device DS-2 of an embodiment may further include the fourth light emitting region PXA-W.

The fourth light emitting region PXA-W may be a portion configured to provide light of a wavelength different from those of the first light emitting region PXA-R, the second light emitting region PXA-G, and the third light emitting region PXA-B2. The first light emitting region PXA-R may be a red light emitting region, the second light emitting region PXA-G may be a green light emitting region, and the third light emitting region PXA-B may be a blue light emitting region. For example, the fourth light emitting region PXA-W may be a white light emitting region configured to provide white light.

In the display device DS-2 of an embodiment illustrated in FIG. 18, the third light emitting region PXA-B and the fourth light emitting region PXA-W are illustrated as being arranged to be crossed in the second direction axis DR2 direction. However, embodiments of the present disclosure are not limited thereto. The first light emitting region PXA-R, the second light emitting region PXA-G, the third light emitting region PXA-B2, and the fourth light emitting region PXA-W may be arranged in the first direction axis DR1 direction. Unlike what is illustrated in a drawing, the area of the third light emitting region PXA-B2 and the fourth light emitting region PXA-W may be provided substantially the same as the area of the first light emitting region PXA-R and the second light emitting region PXA-G.

FIG. 19 is a cross-sectional view corresponding to line IV-IV' of FIG. 18. The display device DS-2 of an embodiment may include a display panel DP, a color conversion layer CCL-2 on the display panel DP, a light blocking layer BML on the display panel DP, and a color filter layer CFL-2 on the color conversion layer CCL-2.

The display panel DP may be configured to provide a first color light. The display panel DP may be configured to provide blue light, which is the first light, to the color conversion layer CCL-2.

The color conversion layer CCL-2 may further include a fifth color conversion part CCL5 in addition to a first color conversion part CCL1, a second color conversion part CCL2, and a third color conversion part CCL3. The first color conversion part CCL1 may be configured to convert the wavelength of the first color light and emit red light which is a second light, and the second color conversion part CCL2 may be configured to convert the wavelength of the first color light and emit green light which is a third color light. The third color conversion part CCL3 may be configured to transmit the first color light to emit blue light.

The fifth color conversion part CCL5 may be configured to emit white light. For example, the fifth color conversion part CCL5 may include both a red quantum dot and a green quantum dot to be wavelength-converted by blue light which is a first color light.

The color filter layer CFL-2 may include a fifth filter. For example, the fifth filter CF5 may be a transparent filter. The fifth filter CF5 may include a fifth main filter portion CF5-M, and a fifth light blocking filter portion CF5-B. The fifth filter CF5 may be configured to transmit white light provided from the fifth color conversion part CCL5. The same contents as those described with reference to the display device DS of an embodiment may be applied to the first filter CF1, the second filter CF2, and the third filter CF3.

In the display device DS, the display device DS-1, and the display device DS-2 according to an embodiment described with reference to FIG. 2, FIG. 17 to FIG. 18, respectively, each of the first light emitting region PXA-R, the second light emitting region PXA-G, the third light emitting region PXA-B, the first light emitting region PXA-R1, the second light emitting region PXA-G1, the third light emitting region PXA-B1, the third light emitting region PXA-B2, and the fourth light emitting region PXA-W is illustrated as having a quadrangular shape. However, embodiments of the present disclosure are not limited thereto. The shape of each of the light emitting region may be modified in various suitable ways and provided.

In FIG. 2, FIG. 14, and FIG. 18, respectively, light emitting regions emitting light of the same color in each of the first light emitting region PXA, the first light emitting region PXA-1, and the first light emitting region PXA-2 of the display device DS, the display device DS-1, and the display device DS-2 according to an embodiment are illustrated as having a stripe shape. However, the embodiment of the present disclosure is not limited thereto. Each light emitting region PXA may be arranged in a pentile structure.

A display device of an embodiment includes a color filter layer on a display panel and some filters of the color filter layer are exposed in a portion of a non-light emitting region, so that improved display quality may be exhibited. A display device of an embodiment includes a light blocking layer having a main opening portion defined corresponding to light emitting regions and sub-opening portions defined corresponding to a portion of a non-light emitting region to exposed a portion of a color filter layer in a portion of the non-light emitting region, so that the color sense of reflected light by external light may be adjusted.

Also, a display device of an embodiment adjusts the region of a color filter layer exposed in a non-light emitting region to adjust reflective color sense without changing a method for driving a display panel, so that excellent display quality may be exhibited.

A display device of an embodiment is capable of displaying improved reflective color sense by exposing a portion of a color filter layer in a non-light emitting region.

A display device of an embodiment is also capable of displaying neutral color sense by defining an opening portion in a light blocking layer corresponding to a non-display region to include a color filter not overlapping a light blocking part in a non-light emitting region.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the subject matter of the present disclosure has been described with reference to certain embodiments of the present disclosure, it will be understood by those skilled in the art that various changes in form and details may be made therein without departing from the spirit and scope of the present disclosure.

Accordingly, the technical scope of the present disclosure is not intended to be limited to the contents set forth in the detailed description of the specification, but is intended to be defined by the appended claims, and equivalents thereof.

What is claimed is:

1. A display device comprising:
    a display panel comprising a light emitting region and a non-light emitting region adjacent to the light emitting region;
    a color conversion layer on the display panel;
    a light blocking layer on the display panel, and a main opening portion corresponding to the light emitting region and a sub-opening portion corresponding to the non-light emitting region, the main opening portion and the sub-opening portion being defined at the light blocking layer; and
    a color filter layer on the color conversion layer, wherein:
    the color filter layer comprises:
    a main filter portion corresponding to the main opening portion;
    a sub-filter portion corresponding to the sub-opening portion; and
    a light blocking filter portion corresponding to the non-light emitting region and not overlapping the sub-opening portion.

2. The display device of claim 1, wherein the display panel comprises an organic electroluminescent device configured to emit a first color light.

3. The display device of claim 2, wherein the color conversion layer comprises:
    a first color conversion part comprising a first quantum dot configured to convert the first color light into a second color light;
    a second color conversion part comprising a second quantum dot configured to convert the first color light into a third color light; and
    a third color conversion part configured to transmit the first color light.

4. The display device of claim 3, wherein the color filter layer comprises:
    a first filter configured to transmit the second color light;
    a second filter configured to transmit the third color light; and
    a third filter configured to transmit the first color light, wherein each of the first filter, the second filter, and the third filter comprises:
    the main filter portion and the light blocking filter portion, and
    at least one selected from the first filter, the second filter, and the third filter further comprises the sub-filter portion.

5. The display device of claim 4, wherein the first color light is blue light, the second color light is red light, and the third color light is green light, and
    the first filter and the third filter comprise the sub-filter portion, but the second filter does not comprise the sub-filter portion.

6. The display device of claim 4, wherein the third color conversion part and the third filter are provided integrally.

7. The display device of claim 3, wherein the first color conversion part and the third color conversion part further comprise a scattering agent.

8. The display device of claim 3, wherein the color filter layer comprises:

a third filter overlapping the third color conversion part and configured to transmit the first color light; and a fourth filter overlapping the first color conversion part and the second color conversion part and configured to transmit a fourth color light.

9. The display device of claim 1, wherein the light blocking layer is between the display panel and the color filter layer.

10. The display device of claim 1, wherein the light blocking layer is on the color conversion layer, and the color filter layer covers the light blocking layer.

11. The display device of claim 1, wherein the color filter layer is directly on the color conversion layer.

12. A display device comprising:
    a light emitting region, a reflective region spaced apart from the light emitting region on a plane, and a light blocking region surrounding the light emitting region and the reflective region, comprising:
    a display panel comprising an organic electroluminescent device;
    a color conversion layer on the display panel and comprising a plurality of color conversion parts located to correspond to the light emitting region;
    a color filter layer on the color conversion layer and comprising a plurality of filters; and
    a light blocking layer on the display panel and comprising a light blocking part overlapping the light blocking region but not overlapping the light emitting region and the reflective region.

13. The display device of claim 12, wherein the light emitting region comprises:
    a red light emitting region, a green light emitting region, and a blue light emitting region, and
    the reflective region comprises a red reflective region and a blue reflective region.

14. The display device of claim 12, wherein the light emitting region comprises:
    a plurality of red light emitting regions, a plurality of green light emitting regions, and a plurality of blue light emitting regions, wherein:
    the red light emitting regions, the green light emitting regions, and the blue light emitting regions are alternately arranged in a first direction, and
    each of the red light emitting regions, the green light emitting regions, and the blue light emitting regions is arranged in a second direction crossing the first direction.

15. The display device of claim 14, wherein the reflective region comprises:
    a red reflective region between the red light emitting regions arranged in the second direction; and
    a blue reflective region between the blue light emitting regions arranged in the second direction.

16. The display device of claim 13, wherein the organic electroluminescent device is configured to emit blue light, and the color conversion parts comprise:
    a first color conversion part located to correspond to the red light emitting region and comprising a red quantum dot;
    a second color conversion part located to correspond to the green light emitting region and comprising a green quantum dot; and
    a third color conversion part located to correspond to the blue light emitting region.

17. The display device of claim 13, wherein the filters comprise:
    a red filter overlapping the red light emitting region and the red reflective region;
    a green filter overlapping the green light emitting region; and
    a blue filter overlapping the blue light emitting region and the blue reflective region.

18. The display device of claim 13, wherein, on a plane, an area of the red light emitting region is greater than an area of the green light emitting region and an area of the blue light emitting region.

19. The display device of claim 12, wherein a ratio of an area of the reflective region to a total area of the light emitting region, the reflective region, and the light blocking region is greater than 0% to 10% or less.

20. A display device comprising:
    a display panel comprising an organic electroluminescent device;
    a color conversion layer on the display panel and comprising a plurality of color conversion parts spaced apart from each other on a plane;
    a light blocking layer on the organic electroluminescent device and having a main opening portion overlapping the color conversion parts and a sub-opening portion not overlapping the color conversion parts; and
    a color filter layer on the color conversion layer and comprising a plurality of filters, wherein:
    each of the filters comprises a main filter portion overlapping the main opening portion, and a light blocking filter portion adjacent to the main filter portion, and
    at least one of the filters further comprises a sub-filter portion adjacent to the light blocking filter portion and spaced apart from the main filter portion.

\* \* \* \* \*